United States Patent [19]
Zhang

[11] Patent Number: 5,949,107
[45] Date of Patent: *Sep. 7, 1999

[54] SEMICONDUCTOR DEVICE AND METHOD OF FABRICATING SAME

[75] Inventor: Hongyong Zhang, Kanagawa, Japan

[73] Assignee: Semiconductor Energy Laboratory Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/744,201

[22] Filed: Nov. 5, 1996

[30] Foreign Application Priority Data

Nov. 7, 1995 [JP] Japan ................................. 7-313627
Jul. 26, 1996 [JP] Japan ................................. 8-215257

[51] Int. Cl.[6] .......................... H01L 27/01; H01L 27/12; H01L 31/0392; H01L 29/76
[52] U.S. Cl. ........................................... 257/347; 257/346
[58] Field of Search ..................... 257/347, 346

[56] References Cited

U.S. PATENT DOCUMENTS 5,434,441 7/1995 Inoue et al. .
5,569,935 10/1996 Takemura et al. .

OTHER PUBLICATIONS

Muller et al, *Device Electronics for IC's*, pp. 462–463, ©1986.

*Primary Examiner*—Stephen D. Meier
*Attorney, Agent, or Firm*—Fish & Richardson P.C.

[57] ABSTRACT

A semiconductor device having CMOS circuits formed on a glass substrate. The CMOS circuits are composed of TFTs. Lightly doped regions are formed only in the N-channel TFTs. When P-channel TFTs are formed, the conductivity type of the lightly doped regions is converted by a boron ion implant. Each CMOS circuit consists of an N-channel TFT having the lightly doped regions and a P-channel TFT having no lightly doped regions.

13 Claims, 12 Drawing Sheets

NTFT     PTFT

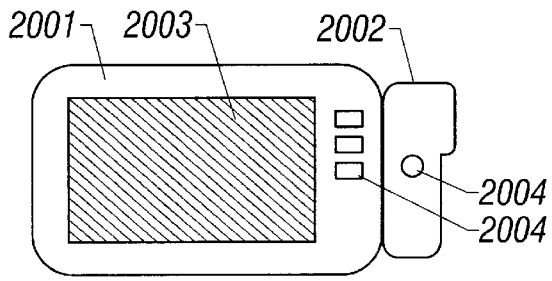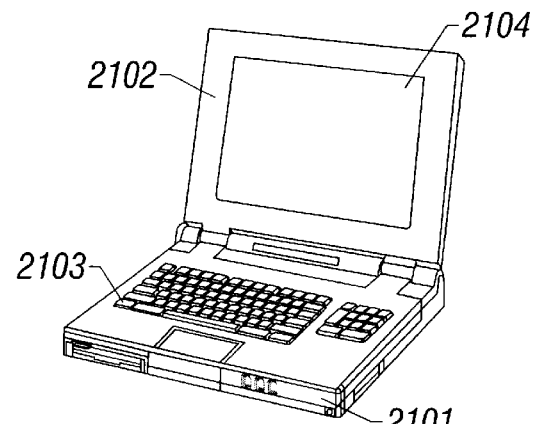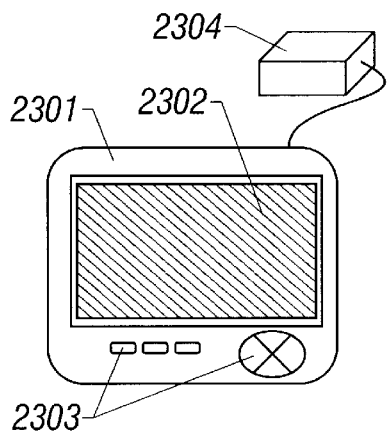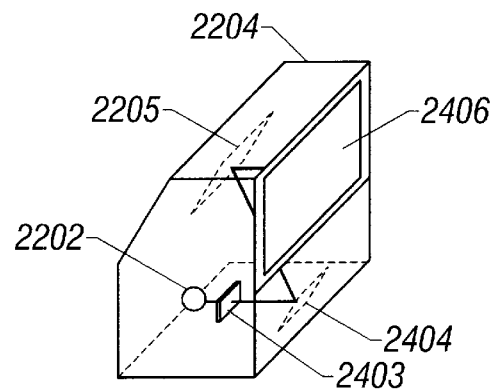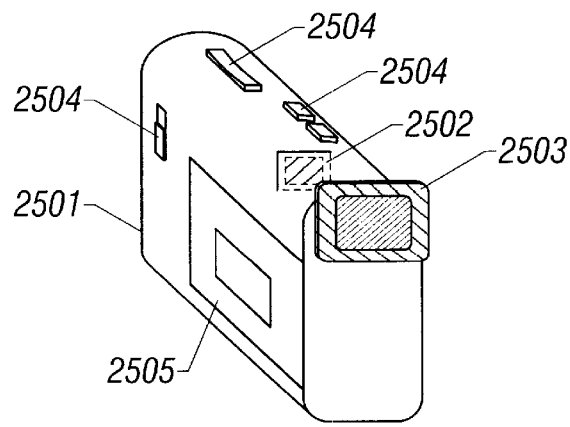
FIG. 12A
FIG. 12B
FIG. 12C
FIG. 12D
FIG. 12E

SEMICONDUCTOR DEVICE AND METHOD OF FABRICATING SAME

BACKGROUND OF THE INVENTION

1. Field of the Invention

The present invention relates to a semiconductor device consisting of P-channel and N-channel thin-film transistors arranged on the same substrate and also to a method of fabricating such a semiconductor device. More particularly, the invention relates to a CMOS circuit configuration composed of thin-film transistors formed on a glass substrate and also to a method of fabricating this CMOS circuit configuration.

2. Description of the Related Art

A technique for fabricating a thin-film transistor (TFT) by growing a thin film of silicon on a glass substrate is known. This technique has been developed to fabricate active matrix liquid crystal displays.

A liquid crystal display comprises a pair of glass substrates together with a liquid crystal material held between the substrates. A large number of pixels are arranged in rows and columns. For each pixel, an electric field is applied across the liquid crystal material to vary its optical property. Thus, an image is displayed.

In the active matrix liquid crystal display, a TFT is disposed at each of the pixels arranged in rows and columns as described above. This TFT controls electric charge going into and out of the pixel electrode.

In the present technology, a peripheral driver circuit for driving hundreds of TFTs X hundreds of TFTs arranged in the active matrix region is composed of an IC circuit (known as a driver IC) attached to the outside of a glass substrate by TAB (tape automated bonding) or other technique.

However, mounting driver IC to the outside of the glass substrate complicates the manufacturing process. Also, the driver IC results in unevenness. This hinders wide application of the liquid crystal display incorporated in various electronic appliances.

A technique for solving these problems consists of fabricating the peripheral driver circuit out of TFTs and integrating these TFTs with other TFTs on the glass substrate. This makes the whole system a unit. Furthermore, the process sequence is simplified, the reliability is enhanced, and the application can be extended.

In this active matrix liquid crystal display incorporating the peripheral driver circuit as described above, CMOS circuits are necessary to form the peripheral driver circuit. A CMOS circuit is a complementary combination of an N-channel transistor and a P-channel transistor, and is one of fundamental configurations of electronic circuits. The following various methods for fabricating CMOS configuration out of TFTs on a glass substrate are known.

One known method is illustrated in FIGS. 4(A)–4(D). As shown in FIG. 4(A), a silicon oxide film 402 acting as a buffer layer is first formed on a glass substrate 401. An active layer, 403 and 404, made of crystalline or amorphous silicon is formed on the silicon oxide film 402. A silicon oxide film 405 serving as a gate-insulating film is coated on the laminate. The active layer portion 403 is an island of region forming an active layer for an N-channel TFT. The active layer portion 404 is an island of region forming an active layer for a P-channel TFT.

After obtaining the state shown in FIG. 4(A), gate electrodes 406 and 407 are fabricated out of silicide or other material (FIG. 4(B)).

Then, as shown in FIG. 4(C), phosphorus (P) ions are implanted while masking the other TFT region with a resist mask 408. As a result, a source region 409, a drain region 411, and a channel formation region 410 for the N-channel TFT are formed by self-aligned technology.

Thereafter, as shown in FIG. 4(D), the resist mask 408 is removed. A new resist mask 412 is placed. At this time, boron (B) ions are implanted. By this manufacturing step, a source region 415, a drain region 413, and a channel formation region 414 for the P-channel TFT are formed by self-aligned technology.

In this way, the N-channel and P-channel TFTs can be formed simultaneously on the same glass substrate. In the configuration shown in FIGS. 4(A)–4(D), the drain region 411 of the P-channel TFT is connected with the drain region 413 of the N-channel TFT. The gate electrodes of both TFTs are connected together. Consequently, a CMOS configuration is obtained.

The manufacturing steps shown in FIGS. 4(A)–4(D) are the most fundamental processes for CMOS circuits. However, two separate masks 408 and 412 used for implantation of dopant ions for imparting N-type conductivity and P-type conductivity, respectively, are necessary. This complicates the process sequence. That is, the two resist masks 408 and 412 are necessitated during the dopant ion implantation.

In order to form each resist mask, a resist material must be applied, sintered, selectively exposed, using a photomask, and selectively removed for formation of the resist mask. Furthermore, where dopant ions are implanted, using a resist as a mask, the resulting ion bombardment modifies the quality of the resist. This makes it difficult to remove the resist mask.

Where the manufacturing steps illustrated in FIGS. 4(A)–4(D) are adopted, it follows that two manufacturing steps for removing the resist material which has been modified in quality and thus is difficult to remove are performed. This will be another factor of defects. Hence, these two steps are undesirable.

A known method of alleviating this problem is illustrated in FIGS. 5(A)–5(D). As shown in FIG. 5(A), a silicon oxide film 502 is formed as a buffer layer on the glass substrate 401. An active layer, 503 and 504, of crystalline or amorphous silicon is formed on the silicon oxide film 502. A silicon oxide film 505 acting as a gate-insulating film is formed over the laminate. The active layer portions 503 and 504 are islands of regions forming active layers for N- and P-channel TFTs, respectively. Then, gate electrodes 506 and 507 of silicide or other material are formed, thus giving rise to a state shown in FIG. 5(B).

Under this condition, phosphorus (P) ions are implanted into the whole surface. As a result, N-type regions 508, 510, 511, and 513 are formed (FIG. 5(C)). The dose of the P ions is $1 \times 10^{15}$ to $2 \times 10^{15}$ ions/cm$^2$. The surface dose is $1 \times 10^{20}$ ions/cm$^2$ or more.

Then, a resist mask 514 is placed only on selected regions forming an N-channel TFT. Boron (B) ions are implanted at a dose about 3 to 5 times as high as the dose of the aforementioned P ions. The N-type regions 511 and 513 are converted into P-type. In this way, P-channel source region 515, drain region 516, and channel formation region 512 are formed by self-aligned technology.

The heavy doping described above is required because it is necessary that the regions 515, 512, and 516 form an NIN junction. In this manner, N- and P-channel TFTs can be obtained with a fewer number of masks than the configuration shown in FIG. 4(A)–4(D). In the configuration shown in FIGS. 5(A)–5(D), the N-channel TFT has the source region 508, channel formation region 509, and drain region 510. The P-channel TFT has the drain region 516, channel formation region 512, and drain region 515. Although the configuration shown in FIGS. 5(A)–5(D) has the advantage that it can be manufactured with simplified manufacturing steps, the configuration has the following drawbacks.

First, dopant ions are implanted into the resist mask 514 at a quite high dose. This gives rise to a conspicuous modification of the quality of the resist. This in turn often results in defective manufacturing steps.

Secondly, the right TFT (P-channel TFT) as viewed in FIGS. 5(A)–5(D) has the channel formation region. The drain region adjacent to this channel formation region is a quite heavily doped region. The dose is in excess of the dose necessary for the P-channel type and sufficient for type-conversion. Therefore, the off current near the junction between the channel formation region and the drain region is negligible.

Thirdly, ions take unstraight paths, thus introducing B ions into the channel formation region 512. As a consequence, required characteristics cannot be obtained.

Fourthly, implanting dopant ions at a high dose imposes heavy burden on the ion implanter and on the plasma implant machine. Also, much labor is required to decontaminate the inside of the machine and to service the machine. In this way, various problems take place.

Fifthly, introducing dopant ions at a high dose increases the processing time.

Sixthly, where annealing is carried out with laser light, difficulties occur. After the step shown in FIG. 5(D), the resist mask 514 is removed. Then, an annealing step for activating the implanted dopants and annealing the doped regions with laser irradiation is necessary. This method is useful where a glass substrate having poor heatproofness is used. At this time, the regions 515 and 516 are more severely deteriorated in crystallinity than the regions 508 and 510, because the regions 516 and 516 are more heavily doped than the regions 508 and 510. Therefore, the regions 508 and 510 differ greatly from the regions 515 and 516 in dependence of light absorption coefficient on wavelength. Under this condition, the annealing effect of the laser irradiation differs materially between these two kinds of regions. Consequently, the left N-channel TFT and right P-channel TFT have greatly different characteristics with undesirable results.

SUMMARY OF THE INVENTION

It is an object of the present invention to provide techniques for circumventing the problem occurring when N- and P-channel TFTs are fabricated at the same time, i.e., increase in the number of masks, and the problem with the steps illustrated in FIGS. 5(A)–5(D), i.e., high-dose dopant ion implantation.

Specifically, the invention is intended to provide techniques for fabricating both N- and P-channel TFTs on a glass substrate at a lower cost and with a reduced amount of labor than heretofore and with high reliability.

It is another object of the invention to provide a method of fabricating a CMOS circuit out of TFTs in such a way that the CMOS circuit has high characteristics by compensating for the differences in characteristics between the N- and P-channel TFTs.

One embodiment of the present invention is a semiconductor device comprising an N-channel thin-film transistor and a P-channel thin-film transistor having source and drain regions, said N-channel and P-channel thin-film transistors being integrated on a common substrate. Lightly doped drain (LDD) regions are formed selectively only in the N-channel thin-film transistor. The source and drain regions of the P-channel thin-film transistor are doped with P-type and N-type dopants at first and second doses, respectively. The first dose is higher than the second dose.

A specific example of this configuration is shown in FIG. 3(B), where an N-channel TFT (NTFT) located on the left side and a P-channel TFT (PTFT) located on the right side together form a CMOS circuit. This configuration is characterized in that a lightly doped drain (LDD) region 123 is formed selectively only in the NTFT. This LDD region 123 is located between the channel formation region and the drain region. This LDD region mitigates the electric field intensity between the channel formation region and drain region, thus reducing the off current and suppressing deterioration. Furthermore, the LDD region increases the resistance between the source and drain so that the effective mobility of the TFTs is reduced.

The configuration shown in FIG. 3(B) is similar to the configuration shown in FIG. 2(B) except that a dopant (P) for imparting conductivity N-type is introduced also in the right P-channel TFT. In order that the TFT finally act as a P-channel device, the source and drain regions of the right P-channel TFT are more heavily doped with a P-type dopant than an N-type dopant. For this purpose, B ions are implanted during a step illustrated in FIG. 2(C).

Where silicon is used as a semiconductor, phosphorus (P) is a typical example of the N-type dopant which imparts conductivity N-type. Also, where silicon is used as a semiconductor, boron (B) is a typical P-type dopant.

Where the configuration shown in FIG. 3(B) is employed, those portions in the source and drain region of the P-channel TFT which are adjacent to the channel formation region are more lightly doped with the N-type dopant than other portions. The concentration of the P-type dopant is uniform or substantially uniform over the whole source and drain regions, because P ions imparting conductivity N-type are implanted in the steps shown in FIGS. 1(E) and 2(B), respectively. More specifically, regions 125 and 128 are implanted with P ions twice, but regions 126 and 127 are implanted with dopant ions only once. As a result, the regions 126 and 127 adjacent to the channel formation regions 131 are doped with P ions more lightly than the source region 128 and drain region 125.

On the other hand, the dopant ions imparting the conductivity P-type are implanted only once, as shown in FIG. 2(C). Therefore, the source and drain regions are wholly doped with the P-type dopant uniformly or nearly uniformly.

Another embodiment of the invention is a semiconductor device comprising: an active matrix region formed on a substrate and consisting of thin-film transistors arranged in rows and columns; a peripheral driver circuit for driving said thin-film transistors in said active matrix region, said peripheral driver circuit being formed on said substrate; N-channel thin-film transistors having LDD or offset gate regions and arranged in said active matrix region; complementary N- and P-channel thin-film transistors arranged in said peripheral driver circuit; LDD regions or offset gate regions formed selectively in the N-channel thin-film transistors arranged in said peripheral driver circuit; and said P-channel thin-film transistors arranged in said peripheral driver circuit having source and drain regions doped with an N-type dopant imparting conductivity N-type.

A further embodiment of the invention is a semiconductor device comprising: an active matrix region formed on a substrate and consisting of thin-film transistors arranged in rows and columns; a peripheral driver circuit for driving said thin-film transistors in said active matrix region, said peripheral driver circuit being formed on said substrate; P-channel thin-film transistors arranged in said active matrix region; complementary N- and P-channel thin-film transistors arranged in said peripheral driver circuit; LDD regions or offset gate regions formed selectively in the N-channel thin-film transistors arranged in said peripheral driver circuit; and said P-channel thin-film transistors arranged in said active matrix region and in said peripheral driver circuit having source and drain regions doped with an N-type dopant imparting conductivity N-type.

A yet other embodiment of the invention is a method of fabricating a semiconductor device consisting of N-channel and P-channel thin-film transistors integrated on a common substrate, said method comprising the steps of: forming gate electrodes out of a material capable of being anodized, said gate electrodes having side surfaces; selectively forming a porous anodic oxide film on the side surfaces of said gate electrodes; implanting an N-type dopant, using said anodic oxide film as a mask, at a first dose; removing said anodic oxide film; implanting an N-type dopant, using said gate electrodes as a mask, at a second dose to form LDD regions under which said anodic oxide film existed; and implanting a P-type dopant while masking only those regions which should become the N-channel thin-film transistors.

Specific examples of the above-described structure are given below. FIG. 1(D) shows a manufacturing step for forming a porous anodic oxide film, 112 and 113, selectively on side surfaces of gate electrodes made of a material that can be anodized. FIG. 1(E) shows a step for introducing an N-type dopant, using the aforementioned anodic oxide film as a mask. FIG. 2(A) shows a state obtained after the anodic oxide film has been removed. FIG. 2(B) illustrates a step for introducing an N-type dopant, using the gate electrodes 11 as a mask and forming LDD regions under regions 123 where the anodic oxide film existed. FIG. 2(C) shows a manufacturing step for selectively masking those regions which should become N-channel TFTs and implanting a P-type dopant.

A method of fabricating a semiconductor device consisting of N-channel and P-channel thin-film transistors integrated on a common substrate in accordance with the present invention comprises the steps of: forming gate electrodes out of a material capable of being anodized, said gate electrodes having side surfaces; selectively forming a porous anodic oxide film having a thickness on the side surfaces of said gate electrodes; implanting an N-type dopant, using said anodic oxide film as a mask; removing said anodic oxide film; implanting a P-type dopant while masking only regions which should become the N-channel thin-film transistors; and forming offset gate regions selectively in the N-channel thin-film transistors, said offset gate regions being determined by the thickness of said porous anodic oxide film.

This method is characterized in that, as shown in FIGS. 6(A)–6(D). offset gate regions 613 and 614 are formed so as to have a thickness equal to the thickness of a porous anodic oxide film 605. If a dense anodic oxide film 600 is thick, this also contributes to formation of the offset gate regions.

Other objects and features of the invention will appear in the course of the description thereof, which follows.

DETAILED DESCRIPTION OF THE PREFERRED EMBODIMENTS

EXAMPLE 1

In the present example, a CMOS configuration is built on a glass substrate, using thin-film transistors (TFTs). The process sequence of the present example is shown in FIGS. 1(A)–1(E), 2(A)–2(D), and 3(A)–3(B).

Figure 1A:
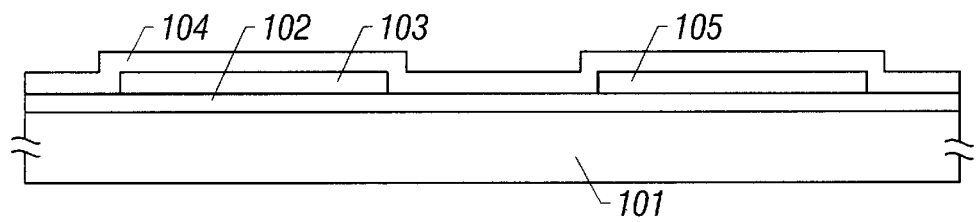
FIGS. 1(A)–1(E) are cross-sectional views of a CMOS TFT circuit according to the present invention, illustrating some process steps for fabricating the circuit.

First, as shown in FIG. 1(A), a silicon oxide film 102 is formed as a buffer layer on a glass substrate 101 by sputtering or plasma CVD to a thickness of about 3000 Å. The glass substrate can be made of Corning 7059 glass or Corning 1737 glass. Furthermore, a transparent quartz substrate having high heatproofness can be used as the glass substrate although it is expensive.

After formation of the silicon oxide film 102, a silicon film which will become an- active layer for TFTs later is grown. In this example, an amorphous silicon film (not shown) is formed to a thickness of 500 Å by plasma CVD or LPCVD.

After forming the amorphous silicon film (not shown), it is crystallized by laser irradiation, heat-treatment, or a combination of them. In this way, a crystalline silicon film (not shown) is obtained.

This crystalline silicon film (not shown) is patterned to form an active layer, 104 and 105, for N- and P-channel TFTs, respectively. Then, a silicon oxide film 103 acting as a gate-insulating film is formed to a thickness of 1000 Å by plasma CVD.

In this way, the state shown in FIG. 1(A) is obtained. For simplicity, it is assumed that one pair of N-channel and P-channel TFTs is formed. Generally, hundreds or more of pairs of N-channel and P-channel TFTs are formed on the same glass substrate.

Figure 1B:
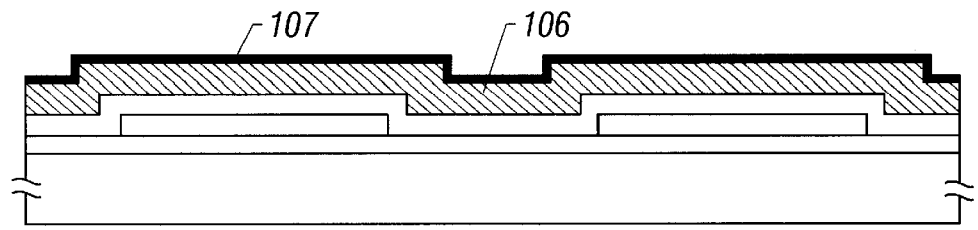

After deriving the condition shown in FIG. 1(A), an aluminum film 106 which will form gate electrodes later is formed by sputtering or electron-beam evaporation, as shown in FIG. 1(B). In order to suppress generation of hillocks and whiskers, the aluminum film contains 0.2% by weight of scandium. Hillocks are small, elevated areas. Whiskers are needle-like protrusions. Both kinds of protrusions are produced by abnormal growth of aluminum. Hillocks and whiskers cause electrical shorts and crosstalks between adjacent conductive interconnects and between adjacent metallization levels.

Besides aluminum, a metal such as tantalum capable of being anodized can be used. After growing the aluminum film 106, an anodization process is carried out within an electrolytic solution, using the aluminum film 106 as an anode. As a result, a thin, dense, anodic oxide film 107 is formed.

In this example, the electrolytic solution is prepared by neutralizing ethylene glycol solution containing 3% tartaric acid with ammonia. This anodization method permits formation of a dense anodic oxide film. The film thickness can be controlled by the applied voltage.

In this example, the thickness of the anodic oxide film 107 is about 100 Å. This anodic oxide film 107 acts to promote adhesion to a resist mask formed later. In this way, a state shown in FIG. 1(B) is obtained.

Then, a resist mask, 108 and 109, is formed. Using this resist mask, 108 and 109, the aluminum film 106 and the overlying anodic oxide film 107 are patterned, thus obtaining a state shown in FIG. 1(C).

Subsequently, using 3% aqueous solution of oxalic acid, an anodization process is performed while employing an aluminum film pattern, 110 and 111, left in the solution as an anode.

During this anodization process, anodization selectively progresses on the side surfaces of the left aluminum film pattern, 110 and 111, because the dense anodic oxide film and the resist mask, 108 and 109, remain on the top surface of the aluminum film pattern, 110 and 111

As a result of this anodization, a porous anodic oxide film is formed. This porous film can be grown up to several micrometers. It is to be noted that the aforementioned anodic oxide film can be grown up to about 3000 Å. Consequently, the anodic oxide film, or more correctly anodic oxide, indicated by 112 and 113, is formed. In this example, the anodization is caused to proceed until a film thickness of 7000 Å is reached. This film thickness of the anodic oxide will determine the length of lightly doped regions formed later. Empirically, it is desired to grow the porous anodic oxide film to 6000–8000 Å. In this way, a state shown in FIG. 1(D) is obtained.

Under this condition, gate electrodes 11 and 12 are defined. After obtaining the state shown in FIG. 1(D), the resist mask, 108 and 109, is removed.

Then, an anodization process is carried out, using an electrolytic solution prepared by neutralizing ethylene glycol solution containing 3% tartaric acid with ammonia. In this process, the electrolytic solution enters the porous anodic film, 112 and 113. As a result, a dense anodic oxide film, 114 and 115, is formed, as shown in FIG. 1(E).

This dense anodic oxide film, 114 and 115, has a thickness of 600 Å. The remaining portions of the previously formed dense anodic oxide film 107 merge with the anodic oxide film, 114 and 115.

Figure 1C:
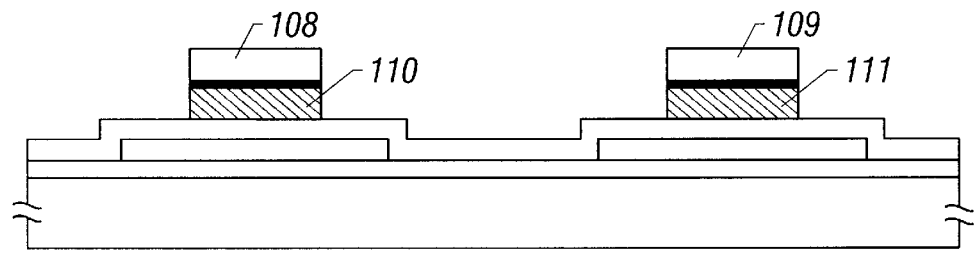
Figure 1D:
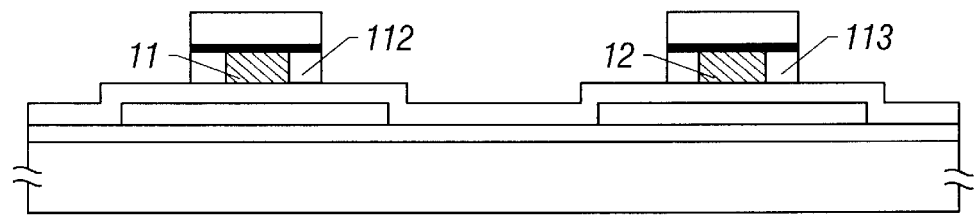
Figure 1E:
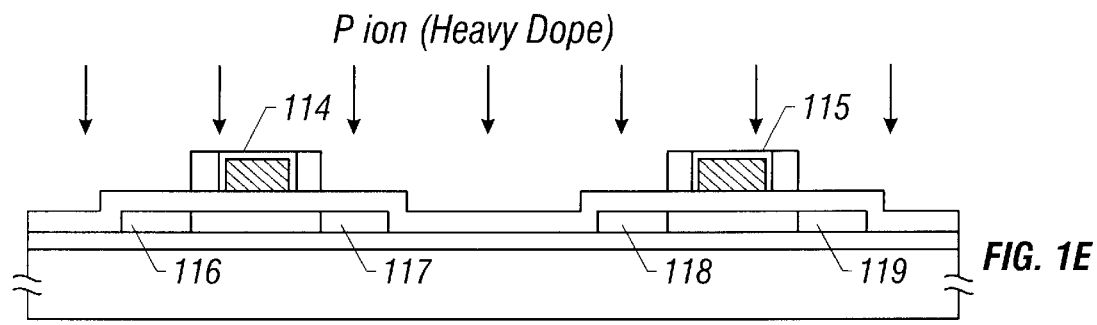

Under the condition shown in FIG. 1(E), phosphorus (P) ions are implanted as an N-type dopant imparting conductivity N-type into the whole surface by plasma doping. This implant is performed at a high dose of 0.2 to $5 \times 10^{15}/cm^2$, preferably 1 to $2 \times 10^{15/cm^2}$. This doping is conveniently referred to as heavy doping. As a result of the step shown in FIG. 1(E), regions 116, 117, 118, and 119 heavily doped with P ions are formed.

Figure 2A:
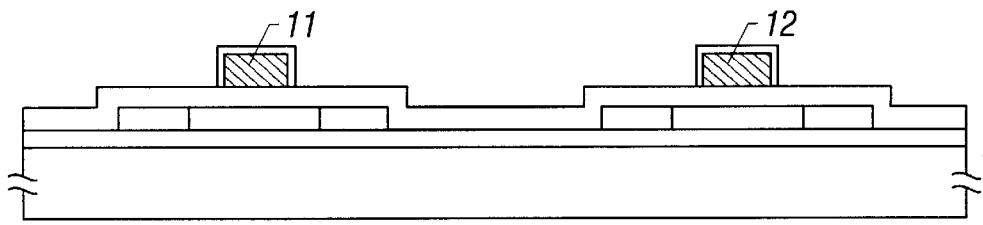
FIGS. 2(A)–2(D) are cross-sectional views, illustrating process steps carried out after the steps shown in FIGS. 1(A)–1(E)
Figure 2B:
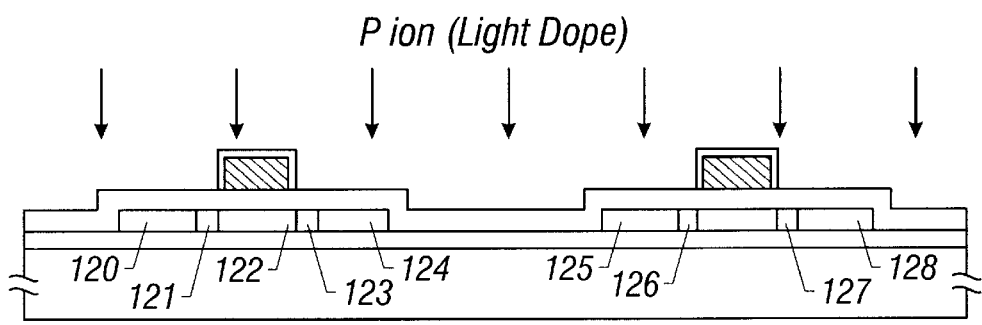

Then, the porous anodic oxide film, 112 and 113, is removed, using aluminum mixed acid. In this way, a state shown in FIG. 2(A) is obtained. Then, P ions are again implanted, as shown in FIG. 2(B) at a low dose of 0.1 to $5 \times 10^{14}/cm^2$, preferably 0.3 to $1 \times 10^{14}/cm^2$. In this ion implantation, the P concentration at the surface is less than $2 \times 10^{19}/cm^3$. That is, the dose of the P ions introduced by the step shown in FIG. 2(B) is lower than the dose of the implantation performed by the step shown in FIG. 1(E). This is conveniently referred to as light doping. Consequently, lightly doped regions 121, 123, 126, and 127 are created. Regions 120, 124, 125, and 128 are more heavily doped with P ions.

In this manufacturing step, the region 120 becomes a source region for an N-channel TFT. The regions 121 and 123 are lightly doped regions. The region 124 is a drain region. The region 123 becomes a so-called lightly doped drain (LDD) region.

Figure 2C:
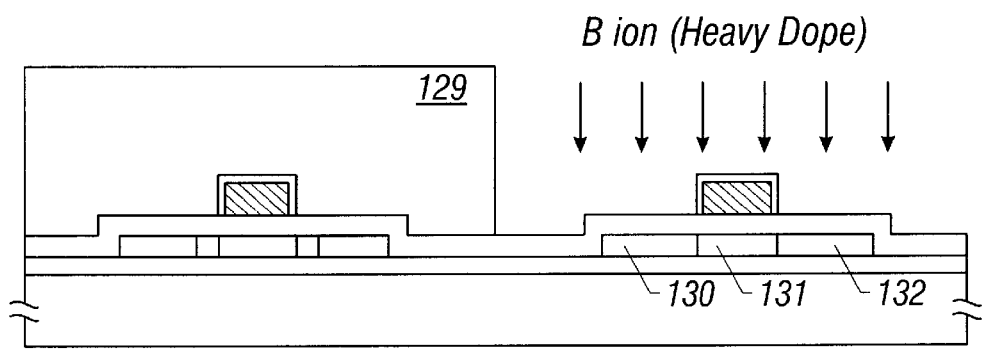

Then, as shown in FIG. 2(C), a resist mask 129 that covers the N-channel TFT is placed. Under the condition shown in FIG. 2(C), boron (B) ions are implanted at a dose of 0.2 to $10 \times 10^{15}/cm^2$, preferably about 1 to $2 \times 10^{15}/cm^2$. This dose can be on the same order as the dose used in the step shown in FIG. 1(E). In this step, the N-type regions 125, 126, 127, and 128 are converted into P-type. In this manner, source region 130 and drain region 132 are formed for a P-channel TFT. A region 131 remains undoped and forms a channel formation region.

Before an implant of B ions is made, the regions 126 and 127 shown in FIG. 2(B) are lightly doped with P ions. Accordingly, the B implant easily converts the conductivity type. Especially, the NI junction with the channel formation region 131 is readily converted into a PI junction. That is, the required junction can be easily created.

Therefore, the conductivity type of the regions 126 and 127 can be converted into the opposite type at a dose comparable to the dose of the P ion implant carried out in the step FIG. 1(E). As a result, P-type doped regions 130 and 132 can be formed.

Since the dose can be made lower than in the prior art technique illustrated in FIGS. 5(A)–5(D), modification of quality of the resist mask due to dopant implantation can be suppressed.

Figure 2D:
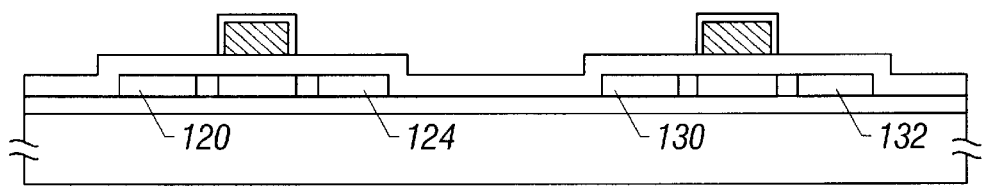

After the completion of the step shown in FIG. 2(C), the resist mask 129 is removed, thus obtaining a state shown in FIG. 2(D). Under this condition, laser irradiation is performed to activate the implanted dopant and to anneal the doped regions. At this time, the source/drain regions 120 and 124 of the N-channel TFT does not differ greatly in crystallinity from the source/drain regions 130 and 132 of the P-channel TFT, because no quite heavy doping is done in the step of FIG. 2(C), unlike the prior art process shown in FIG. 5(D). Hence, the annealing effect can compensate for the difference in crystallinity. As a result, the difference in characteristics between the obtained N- and P-type TFTs can be compensated for.

Figure 3A:
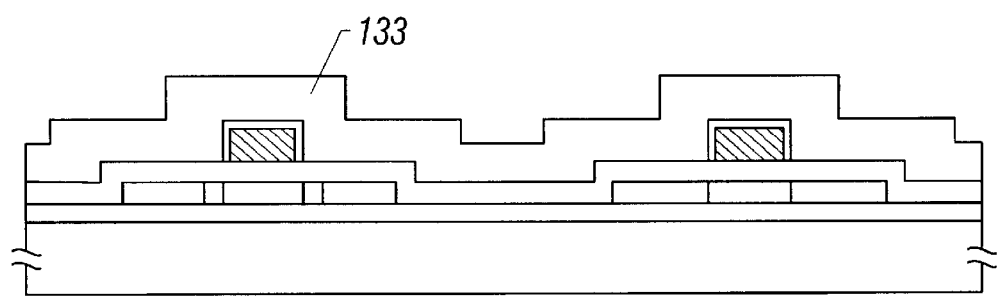
FIGS. 3(A)–3(B) are cross-sectional views, illustrating process steps carried out aft the steps shown in FIGS. 2(A)–2(D)

After obtaining the state shown in FIG. 2(D), an interlayer dielectric film 133 is formed by plasma CVD, as shown in FIG. 3(A). The interlayer dielectric film 133 is made of silicon nitride and has a thickness of 4000 Å.

Then, contact holes are created. A source electrode 134 and a drain electrode 135 are formed for the N-channel TFT (NTFT). At the same time, a source electrode 137 and a drain electrode 136 for the P-channel TFT (PTFT) are formed. At this time, the laminate is patterned in such a way that the drain electrode 135 of the N-channel TFT is connected with the drain electrode 136 of the P-channel TFT and that the gate electrodes of the two TFTs are connected together. Thus, a CMOS structure is completed.

Figure 3B:
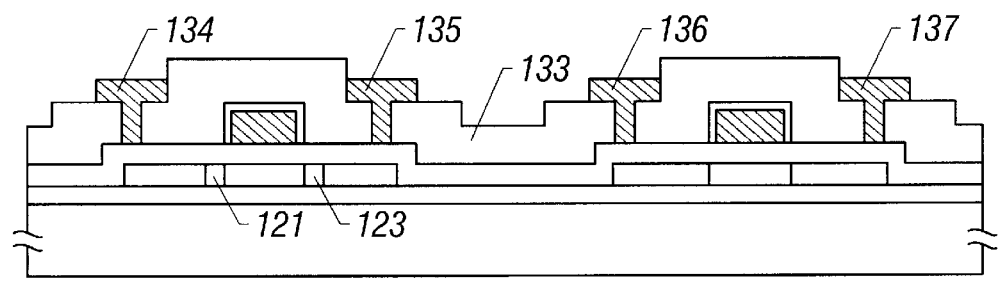
Figure 4A:
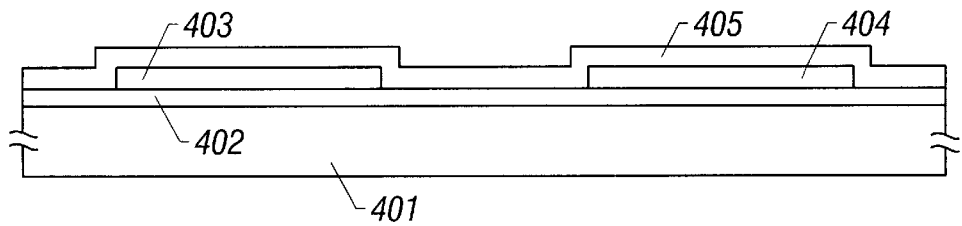
FIGS. 4(A)–4(D) are cross-sectional views of a conventional CMOS TFT circuit, illustrating a process sequence for fabricating the circuit.
Figure 4B:
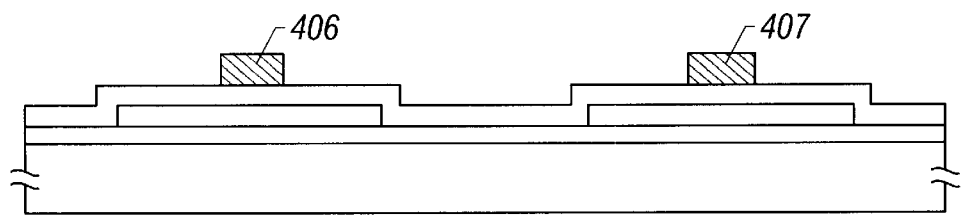
Figure 4C:
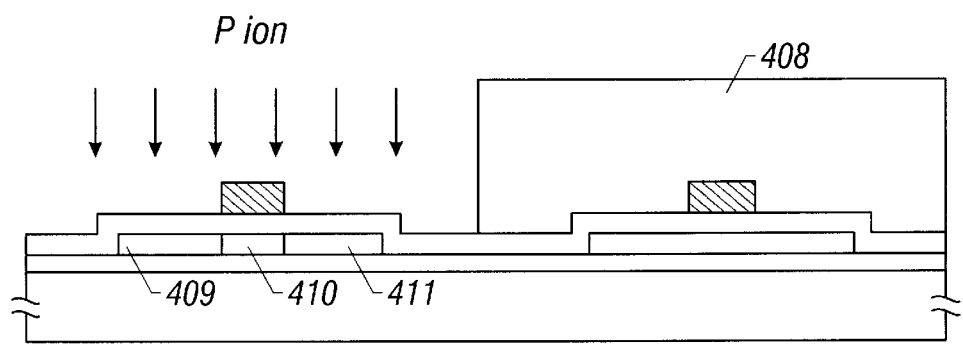
Figure 4D:
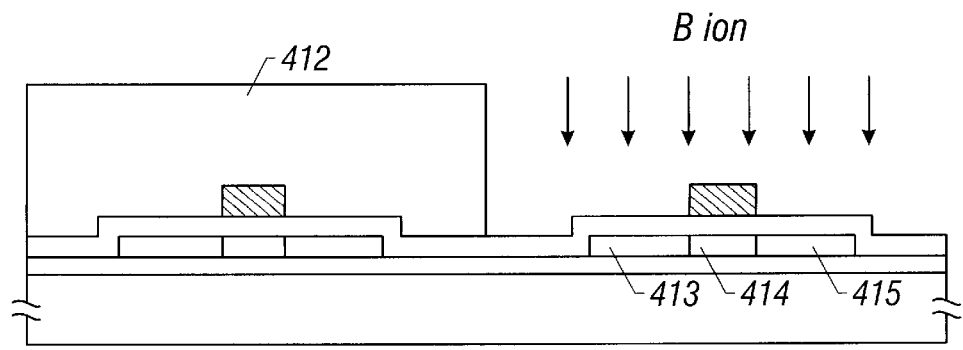
Figure 5A:
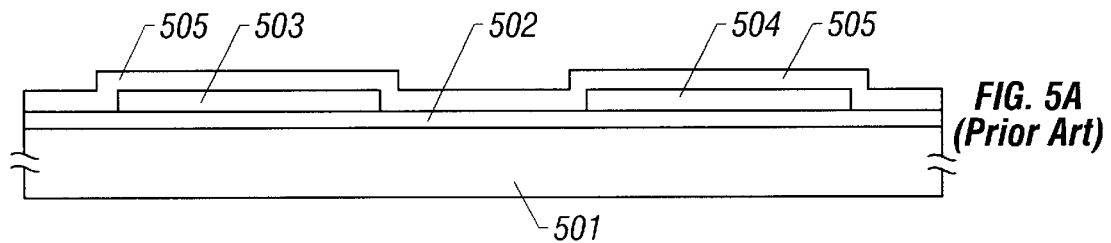
FIGS. 5(A)–5(D) are cross-sectional views of a known CMOS TFT circuit, illustrating a process sequence for fabricating the circuit.
Figure 5B:
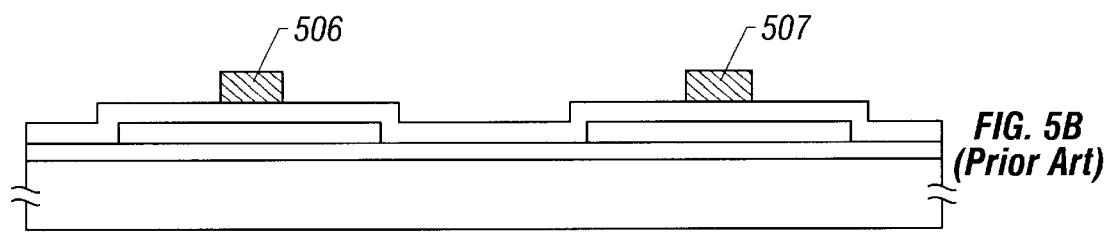
Figure 5C:
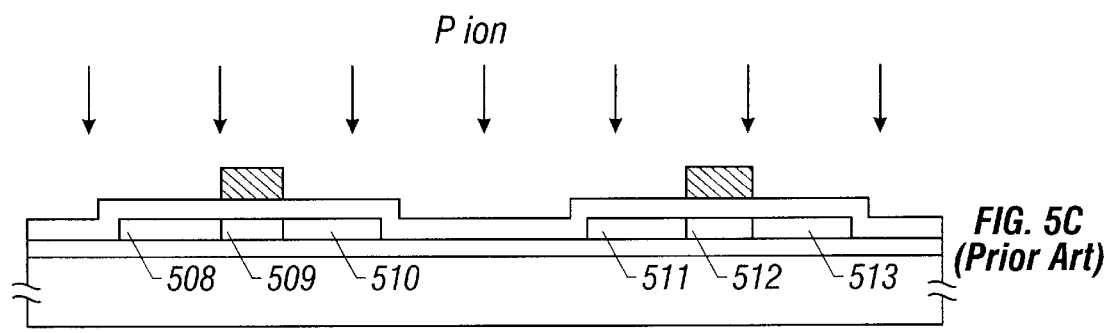
Figure 5D:
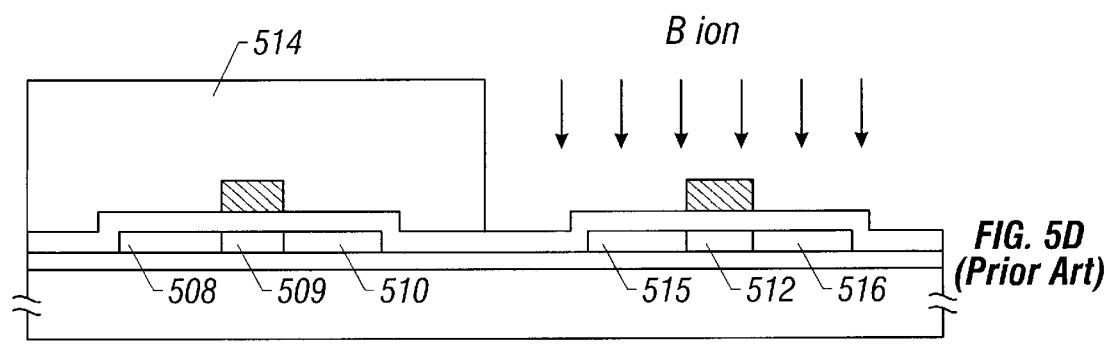

In the CMOS structure shown in FIG. 3(B), the lightly doped regions 121 and 123 are disposed in the N-channel TFT. These lightly doped regions 121 and 123 act to reduce the leakage current. Furthermore, they protect the TFTs from hot carrier deterioration. In addition, they increase the resistance between the source and drain and lower the mobility of the NTFT.

Generally, in the case of the CMOS structure shown in FIG. 3(B), differences in characteristics between the N- and P-channel TFTs present problems. Where a crystalline silicon film is used as in the present example, the mobility of the N-channel TFT reaches 100 to 150 V·s/cm². However, the mobility of the P-channel TFT is only 30 to 80 V·s/cm². Furthermore, the N-channel TFT suffers from hot carrier deterioration, though the P-channel TFT does not have such a drawback. Also, CMOS circuits generally do not require low off current characteristics.

Under these circumstances, the lightly doped regions 121 and 123 are disposed in the N-type TFT. This yields the following advantages. The mobility of the N-type TFT of the CMOS configuration is reduced. Also, the TFT is prevented from being deteriorated. In this way, the balance in characteristics between the N-type and P-type devices is improved. As a consequence, the characteristics of the CMOS circuit can be improved.

In the ion implantation steps shown in FIGS. 1(E), 1(B), and 1(C), it is important that the active layer be masked with the silicon oxide film 103 forming the gate-insulating film. Under this condition, if dopant ions are implanted, roughening or contamination of the active layer surface can be suppressed. This contributes greatly to improvements of the production yield and reliability of the final product.

EXAMPLE 2

The present example relates to a CMOS structure composed of TFTs including N-channel TFTs. The structure is characterized in that offset gate regions are formed only in the N-channel TFTs. The offset gate regions are similar in functions with lightly doped regions typified by LDD regions. In particular, the offset gate regions act to reduce the leakage current. Also, they increase the resistance between the source and drain and thus lower the mobility of the TFT. Furthermore, they protect the N-channel TFT from hot carrier deterioration.

Figure 6A:
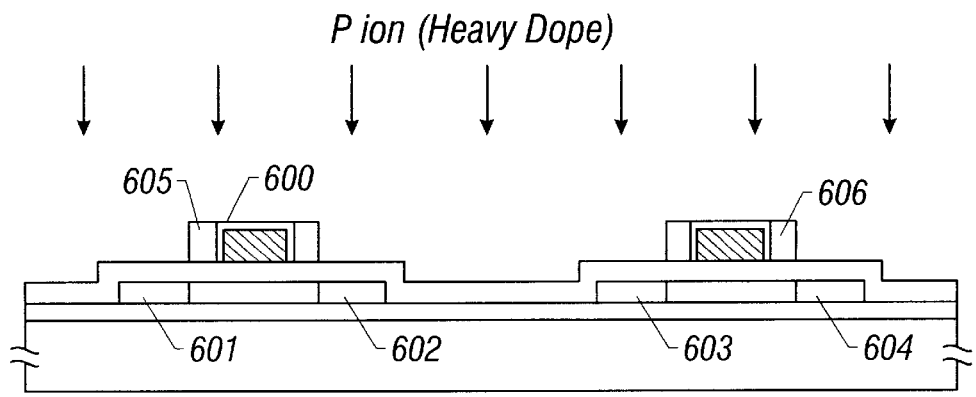
FIGS. 6(A)–6(D) are cross-sectional views of a still other CMOS TFT circuit according to the invention, illustrating a process sequence for fabricating the circuit.

A process sequence for fabricating the CMOS structure of the present example is illustrated in FIGS. 6(A)–6(D). First, a state shown in FIG. 6(A) is obtained by performing steps similar to the steps shown in FIGS. 1(A)–1(E). In FIG. 6(A), a dense anodic oxide film 600 is formed around each gate electrode to a thickness of 600 Å. A porous anodic oxide film, 605 and 606, has a thickness of 2000 to 4000 Å. This film thickness almost determines the dimensions of offset gate regions formed later. Strictly, the thickness of the dense anodic oxide film 600 located inside the porous anodic oxide film affects the dimensions of the offset gate regions. However, as already described in Example 1, the thickness is about 600 Å and so the presence of the inner anodic oxide film 600 is neglected here.

Under this condition, P ions are implanted at a heavy dose of 0.2 to $5\times10^{15}/cm^2$, preferably about 1 to $2\times10^{15}/cm^2$, by ion implantation techniques. As a result, regions 601–604 are heavily doped with P ions.

Figure 6B:
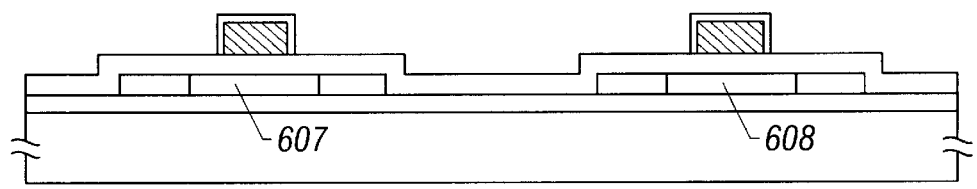

Then, the porous anodic oxide film, 605 and 606, is removed, thus obtaining a state shown in FIG. 6(B). Under this condition, regions 607 and 608 are not doped with P ions.

Figure 6C:
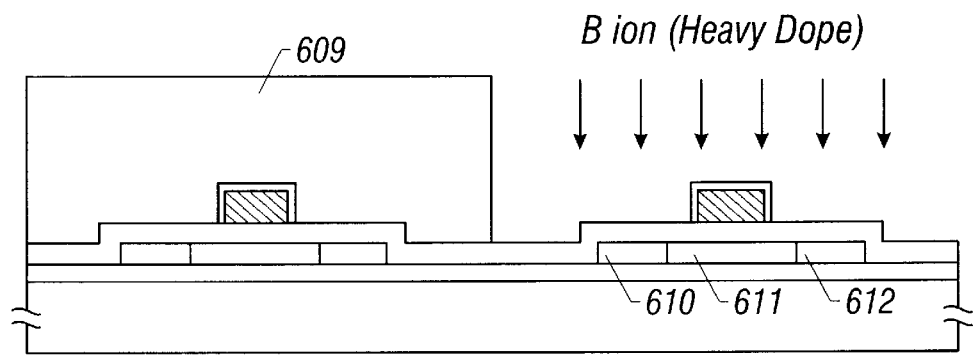

Thereafter, as shown in FIG. 6(C), a resist mask 609 is placed on portions which become the regions of the N-channel TFTs. This is followed by a boron (B) ion implantation. The dose is 0.2 to $5\times10^{15}/cm^2$, preferably 1 to $2\times10^{15}/cm^2$. The implant is made by a plasma doping process. As a result of this step, regions 610 and 612 are doped P-type.

Those regions which are located just under the gate electrode and adjacent to the source/drain regions are not implanted with the P ions in the step of FIG. 6(A). This undoped region is located immediately under the porous anodic oxide film portion 606. Since this undoped region is a substantially intrinsic region, it can be easily converted into P-type by B ion implant shown in FIG. 6(C). Hence, the dose of the B ions in this step can be reduced to a minimum requisite value. In this way, drain region 610, channel formation region 611, and source region 612 of the P-channel TFT can be formed by self-aligned technology.

Figure 6D:
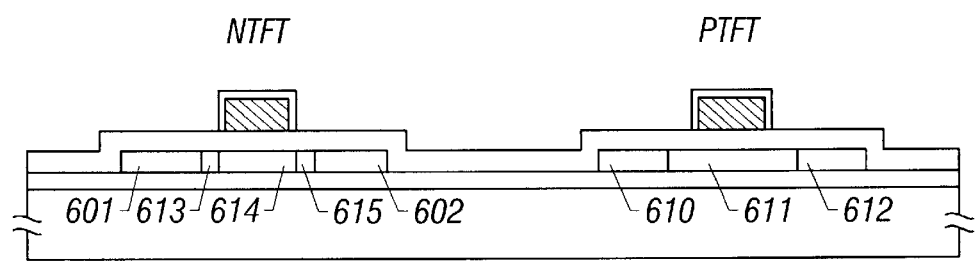

Then, the resist mask 609 is removed, thus obtaining a state shown in FIG. 6(D). Under this condition, indicated by 601 and 602 are the source and drain regions of the N-channel TFT. Indicated by 614 is the channel formation region.

Offset gate regions 613 and 615 are applied with no electric field from the gate electrodes. Also, the offset gate regions 613 and 615 do not act as source/drain regions. These offset gate regions serve to mitigate the field intensity between the source/drain (especially the drain region) and the channel formation region. On the other hand, the P-channel TFT contains no offset gate region.

This configuration substantially reduces the mobility of the N-channel TFT and suppresses deterioration of the characteristics, as previously described in Example 1. In consequence, the balance in characteristics between the N-channel and P-channel TFTs of the CMOS structure is improved.

EXAMPLE 3

The present example is an improvement of the lightly doped region structure formed in the N-channel TFT described in Example 1. A lightly doped region is mainly placed between a channel formation region and a drain region and acts to mitigate the electric field strength between both regions.

Generally, active layers of TFTs have amorphous, microcrystalline, and polycrystalline states and, therefore, the junction structure adjacent to the channel tends to be weak. This gives rise to various problems, including variations in characteristics among TFTs, aging of the characteristics, and deterioration of the reliability.

Accordingly, in the present example, the concentration distribution in the lightly doped region disposed between the channel formation region and the drain (source) region is controlled, thus solving the foregoing problems.

In the lightly doped region of the present example, the dopant concentration gradually decreases from the drain and source region toward the channel formation. If the junction structure is weak, this structure can suppress the various problems with the TFT, i.e., variations in characteristics among individual devices, aging of the characteristics, and deterioration of the reliability.

FIGS. 7(A)–7(D) show a CMOS structure composed of TFTs of the present example. First, the manufacturing steps of Example 1 are performed until the state of FIG. 1(E) is reached, i.e., prior to dopant ion implantation.

Figure 7A:
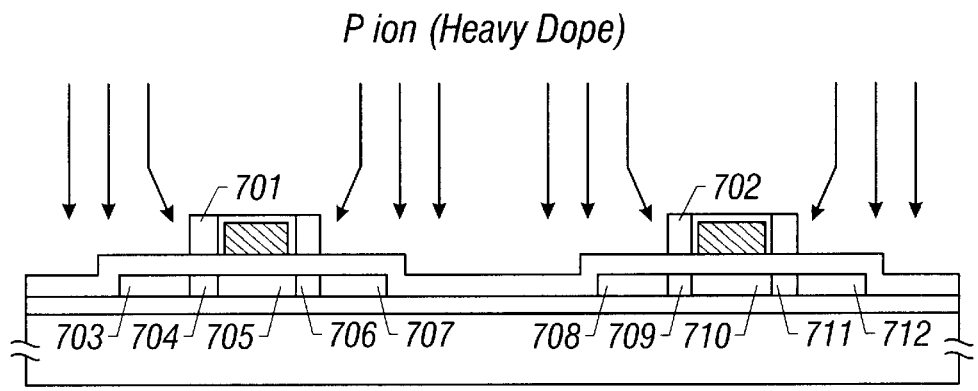
FIGS. 7(A)–7(D) are cross-sectional views of a yet other CMOS TFT circuit according to the invention, illustrating a process sequence for fabricating the circuit.

Then, dopant ions such as P ions are implanted, as shown in FIG. 7(A), under appropriate conditions so that the P ions may be implanted under the porous anodic oxide film, 701 and 702, after following unstraight paths. As a result, heavily doped regions 703, 707, 708, and 712 are formed. In each of lightly doped regions 704, 706, 709, and 711, the dopant concentration varies continuously or in a stepwise manner. Channel formation regions 705 and 710 are left undoped.

Figure 8:
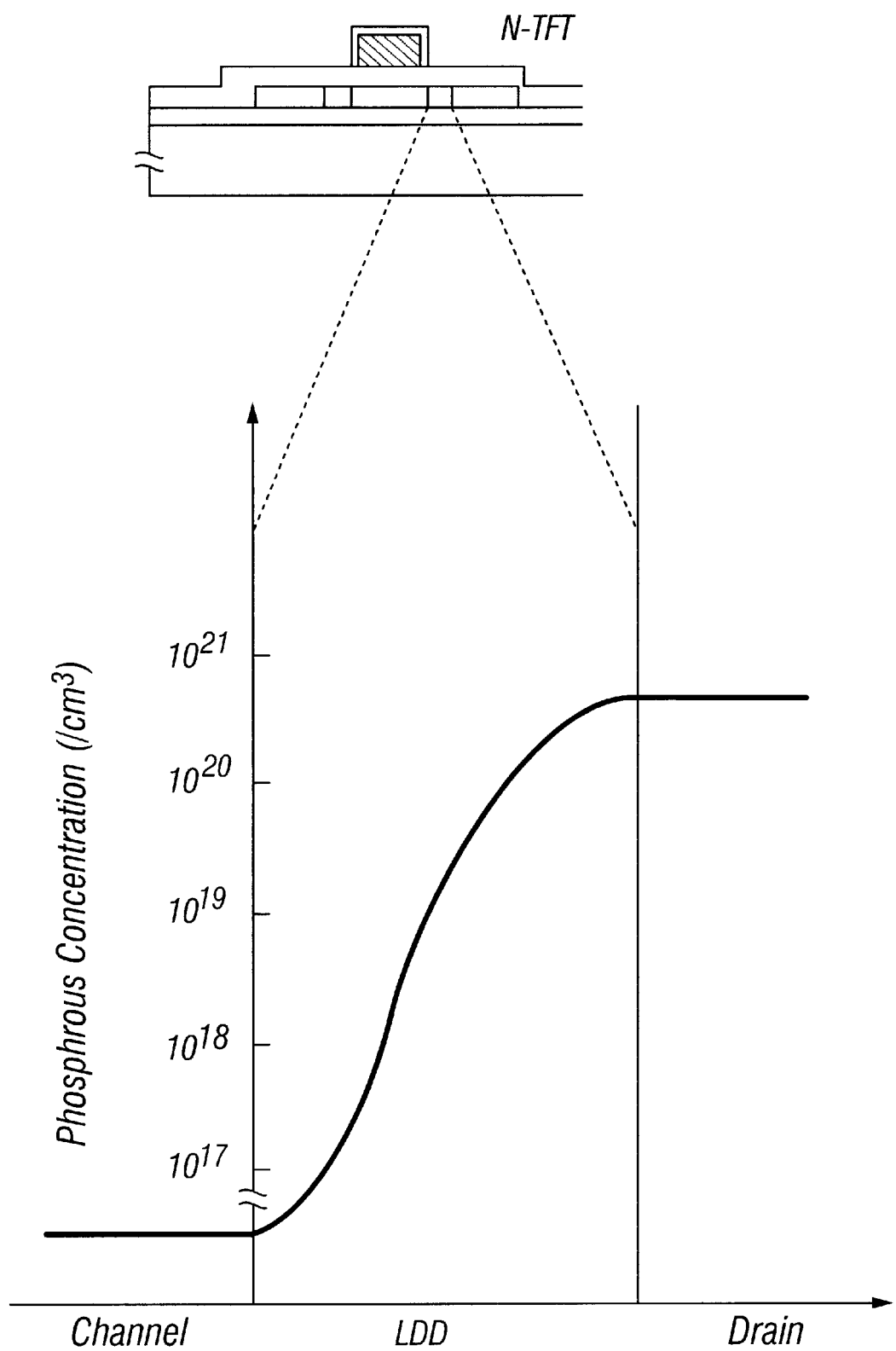
FIG. 8 is a graph showing the dopant distribution in an active layer used in a CMOS circuit according to the invention.

The P ions are implanted into regions becoming source and drain at a dose of 0.2 to $5 \times 10^{15}/cm^2$, preferably 1 to $2 \times 10^{15/cm^2}$. An example of P ion concentration distribution obtained by such a dopant implant is shown in FIG. 8. This concentration distribution can be controlled by the ion implant conditions used in the step shown in FIG. 7(A). The ions giving the concentration distribution shown in FIG. 8 follow unstraight paths because the insulating film overlying each doped region is made to assume a positive potential with respect to the gate electrode by electrification.

In the configuration shown in FIG. 8, the conductivity type can be made to vary continuously or in a stepwise fashion and so the field strength applied to the junction can be mitigated. This enhances the reliability of the device.

Figure 7B:
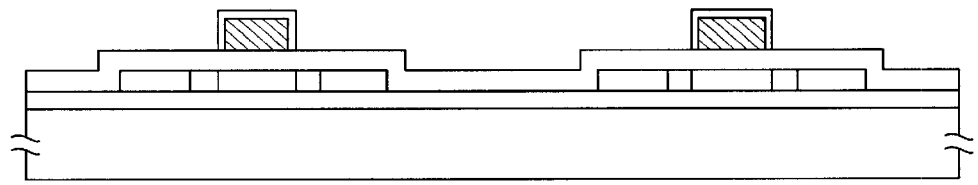
Figure 7C:
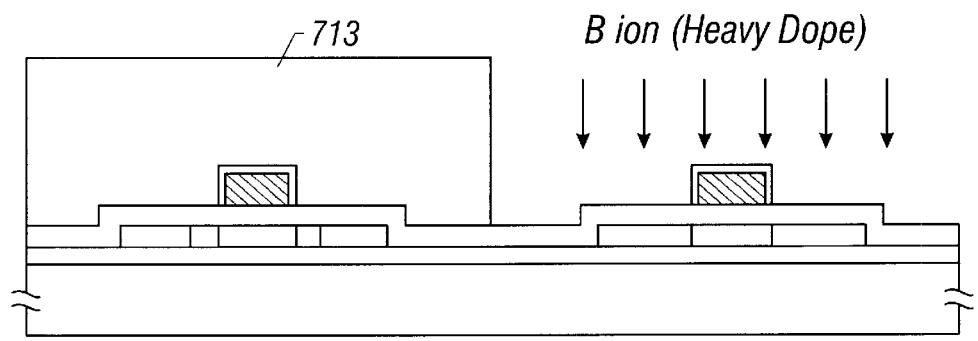
Figure 7D:
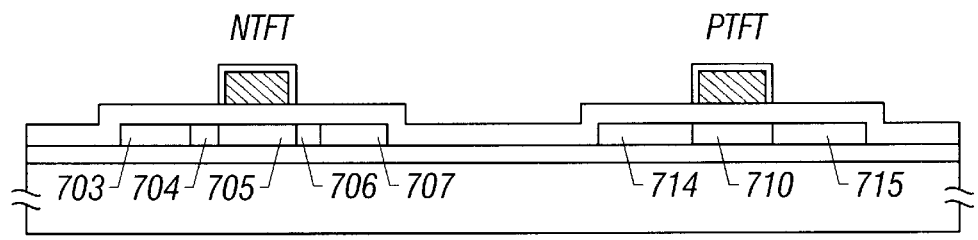

After the implantation of the P ions as shown in FIG. 7(A), the porous anodic oxide film, 701 and 702, is removed, thus obtaining a state shown in FIG. 7(B). Then, a resist mask 713 is placed on the N-channel TFT. Subsequently, boron (B) ions are implanted at a dose of 0.2 to $5 \times 10^{15}/cm^2$, preferably 1 to $2 \times 10^{15/cm2}$ (FIG. 7(C)). As a result of this manufacturing step, the N-type regions 708, 709, 711, and 712 are converted into P-type. Because the regions 709 and 711 are lightly doped also in this step, and because the dopant concentration decreases toward the channel, their conductivity type can be readily converted. Consequently, a P-channel TFT having a drain region 714, a channel formation region 710, and a source region 715 can be derived (FIG. 7(D)).

Also, an N-channel TFT having the source region 703, the lightly doped regions 704, 706, the channel formation region 705, and the drain region 707 is obtained. The drain regions of both TFTs are connected together, and their gate electrodes are connected together. Thus, a CMOS structure is obtained.

In the present example, the presence of the lightly doped regions substantially lowers the mobility of the N-channel TFT and suppresses deterioration of the N-channel type. Furthermore, the balance in characteristics between the P-channel and N-channel types can be corrected. In consequence, a CMOS circuit having high characteristics can be fabricated.

EXAMPLE 4

The present invention relates to a structure in which the channel of the N-channel TFT is lightly doped P-type to control the threshold value of the N-channel TFT.

The process sequence of the present example is similar to the process sequence of Example 1 shown in FIGS. 1(A)–1(E), 2(A)–2(D), and 3(A)–3(B) except that a trace amount of diborane ($B_2H_6$) is added to the gaseous raw material during growth of an amorphous silicon film which is a starting film for the active layer, 104 and 105. The amount of the added diborane may be determined, taking account of the threshold value characteristics of the obtained TFT. More specifically, the amount of the added diborane is so adjusted that the dose of boron finally remaining in the channel formation region is about $1 \times 10^{17}$ to $5 \times 10^{17}/cm^2$.

EXAMPLE 5

In Example 4, the channel formation region of the N-channel TFT is lightly doped P-type in order to control the threshold value of the N-channel TFT. In Example 4, however, the threshold value of the P-channel TFT cannot be controlled at will.

Accordingly, in the present example, under the state shown in FIG. 1(A) or prior to this state, i.e., before the gate-insulating film 103 is formed, dopant ions are selectively implanted into the active layer, 104 and 105. For example, prior to the state shown in FIG. 1(A), i.e., before the gate-insulating film 103 is formed, the active layer portion 105 is masked and B ions are implanted into the active layer portion 104 at a desired dose. As a result, the active layer 104 is lightly doped P-type.

Then, P ions are implanted into the active layer 105 while masking the active layer portion 104. As a result, the active layer portion 105 is lightly doped N-type. In this way, the threshold values of the N-channel and P-channel TFTs can be controlled independently.

After dopant ions are implanted into the active layer as in the present example, annealing is preferably done by heat-treatment or laser irradiation. This annealing is effective in activating the implanted dopant ions and repairing the damage caused by the ion implantation.

EXAMPLE 6

The present example is similar to the configuration of Example 1 except that offset gate regions are formed in addition to the lightly doped regions 121 and 123 (FIG. 2(B)). The offset gate regions protect the devices from hot carrier deterioration and reduce the off current. Also, the offset gate regions substantially lower the mobility by increasing the resistance between the source and drain. That is, the offset gate regions are similar in functions with lightly doped regions typified by LDD regions.

Figure 9A:
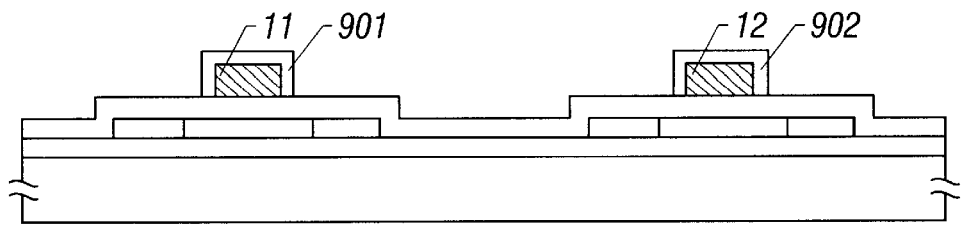
FIGS. 9(A)–9(D) are cross-sectional views of an additional CMOS TFT circuit according to the invention, illustrating a process sequence for fabricating the circuit.

The process sequence of the present example is illustrated in FIGS. 9(A)–9(D) and similar to the process sequence of Example 1 (FIGS. 1(A)–1(E), 2(A)–2(D), and 3(A)–3(B)) unless stated otherwise. It is to be noted that like components are indicated by like reference numerals in various figures. The present example is characterized in that a dense anodic oxide film, 901 and 902, formed over the surface of the gate electrode as shown in FIG. 9(A), has an increased film thickness of 2000 to 2500 Å. The film thickness may be increased further, but the voltage applied during anodization exceeds 300 Å. In this case, reproducibility and safety will present problems.

This dense anodic oxide film is formed essentially similarly to the method of Example 1 except that the applied voltage is varied according to the film thickness. As the applied voltage is increased, the thickness of the anodic oxide film increases.

Figure 9B:
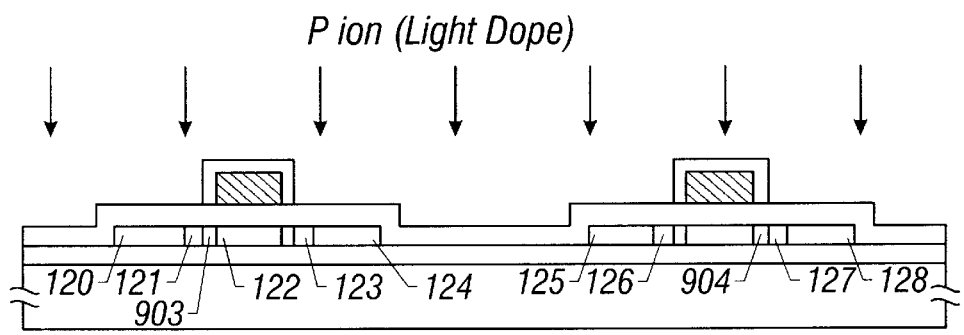

After forming the thick, dense anodic oxide film, 901 and 902, described above (FIG. 9(A)), P ions are implanted under the same conditions as in Example 1 (FIG. 9(B)). A source region 120, a drain region 124, and a channel formation region 122 for an N-channel TFT are formed by self-aligned technology. Also, lightly doped regions 121 and 123 are formed. In this example, the lightly doped region 123 is an LDD region. A pair of offset gate regions 903 are formed on opposite sides of the channel. The offset gate regions 903 act neither as channels nor as source/drain regions. The dimensions of the offset gate regions are substantially determined by the thickness of the dense anodic oxide film 901 formed on the surface of the gate electrode in the step shown in FIG. 9(A).

Figure 9C:
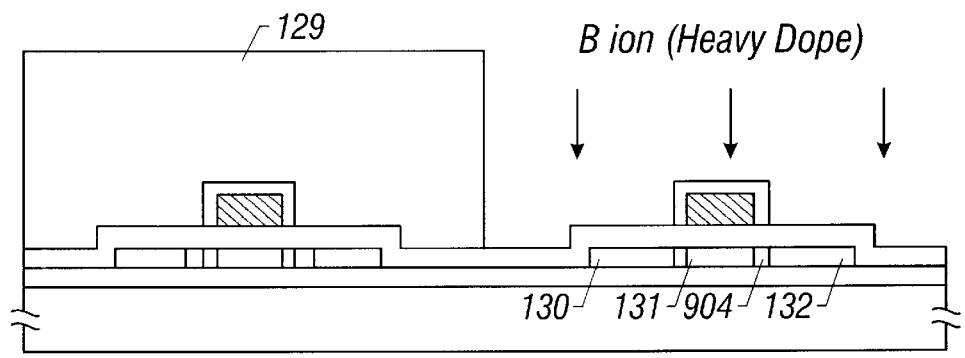

After the end of the step shown in FIG. 9(B), a resist mask 129 is placed and B ions are implanted under the same conditions as in Example 1 (FIG. 9(C)). As a result of this step, a drain region 130, a source region 132, and a channel formation region 131 for a P-channel TFT are formed by self-aligned technology. An offset gate region 904 whose thickness is equal to the anodic oxide film 902 is formed.

Figure 9D:
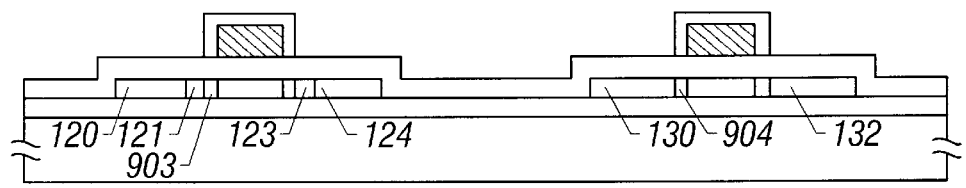

Then, the resist mask 129 is removed, thus obtaining a state shown in FIG. 9(D). Thereafter, annealing making use of laser irradiation is carried out.

In the present example, the left N-channel TFT has both a lightly doped region and an offset gate region. On the other hand, the right P-channel TFT has no lightly doped region but has an offset gate region.

If the thickness of the dense anodic oxide film, 901 and 902, is reduced, then the function of the offset gate regions diminishes. Finally, the same configuration as the configuration of Example 1 is obtained.

No clear minimum width of the offset gate regions exist at which they function satisfactorily. That is, no clear minimum thickness of the anodic oxide film, 901 and 902, exists. Accordingly, in the configuration of Example 1, an offset gate region can exist between the source region and the channel formation region, and another offset gate region can exist between the drain region and the channel formation region irrespective of whether the offset gate regions function satisfactorily.

EXAMPLE 7

The present example relates to a structure in which an active matrix region and a peripheral driver circuit for driving the active matrix region are integrated on a glass substrate.

An integrated active matrix liquid crystal display has a pair of substrates. One of the substrates is made of glass or quartz. The active matrix region has pixels arranged in rows and columns. At least one switching TFT is located at each pixel. The peripheral driver circuit is disposed around the active matrix region. All of these circuits are integrated on the aforementioned glass or quartz substrate.

Where the present invention is applied to this active matrix liquid crystal display, N-channel TFTs having low off current characteristics are arranged in the pixel regions. The peripheral circuit can be composed of CMOS circuits having high characteristics.

In particular, the peripheral circuit is made of the CMOS configuration shown in FIGS. 1(A)–1(E), 2(A)–2(D), and 3(A)–3(B)). The N-channel TFT shown to the left of each of these figures and similar N-channel TFTs are arranged in the active matrix region.

The TFTs disposed in the active matrix region are required to retain electric charge in their pixel electrodes for a given time and so it is desired to make their off current as small as possible. Therefore, TFTs equipped with the lightly doped regions 121 and 123 shown to the left of FIG. 3(B) are best suited for this purpose.

On the other hand, the peripheral driver circuit is frequently made of CMOS circuits. In order to enhance the characteristics of the CMOS circuits, it is necessary that the N- and P-channel TFTs forming each CMOS circuit have quite uniform characteristics. The CMOS configuration shown in FIGS. 1(A)–1(E), 2(A)–2(D), and 3(A)–3(B) is best suited for this purpose. The active matrix liquid crystal display can be constructed by integrating these CMOS circuits each having its preferred characteristics.

In the present example, each N-channel TFT has lightly doped region (LDD) regions. Alternatively, the N-channel TFT may have offset gate regions in the same way as in Example 2. Furthermore, TFTs arranged in the active matrix region can be of the P-type.

EXAMPLE 8

In the present example, LDD regions or offset gate regions are formed without utilizing anodization.

The process sequence of the present example is shown in FIGS. 10(A)–10(E). First, a silicon oxide film 1002 is formed as a buffer layer on a glass substrate 1001. An active layer, 1003 and 1004, made of crystalline silicon is formed. The active layer portion 1003 will become the active layer of an N-channel TFT, while the active layer portion 1004 will become the active layer of a P-channel TFT.

Figure 10A:
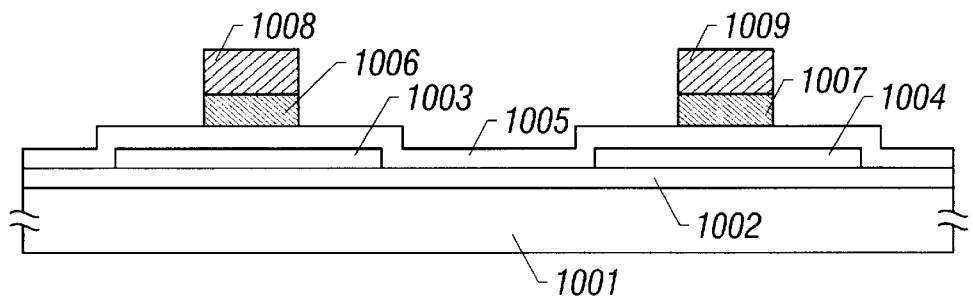
FIGS. 10(A)–10(E) are cross-sectional views of a yet further CMOS TFT circuit according to the invention, illustrating a process sequence for fabricating the circuit.

Then, a silicon oxide film 1005 acting as a gate-insulating film is grown. Thereafter, a silicon film consisting of microcrystallites heavily doped with P or B is formed. Using a resist mask, 1008 and 1009, the film is patterned to form a film pattern, indicated by 1006 and 1007. Gate electrodes will be formed, based on this film pattern. Thus, a state shown in FIG. 10(A) is obtained.

Figure 10B:
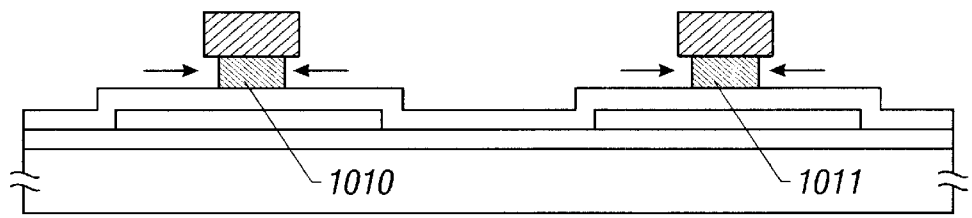
Figure 10C:
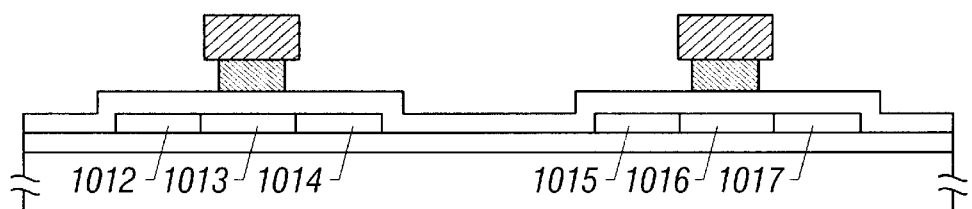

Then, an isotropic dry etching process is carried out to form a pattern, indicated by 1010 and 1011 in FIG. 10(B). Under the condition shown in FIG. 10(C), P ions are implanted at a high dose similarly to other examples described already. Thus, regions 1012, 1014, 1015, and 1017 are heavily doped with P ions. Regions 1013 and 1016 are left undoped.

Figure 10D:
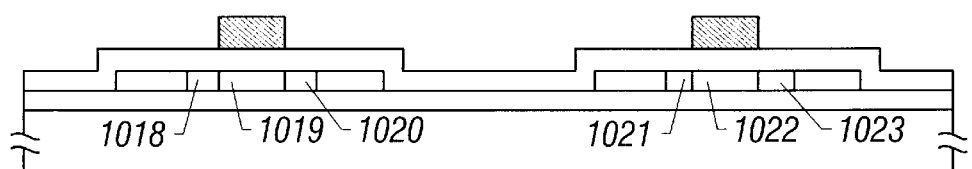

Then, as shown in FIG. 10(D), the resist mask, 1008 and 1009, is removed. P ions are again implanted at a low dose similarly to the other examples previously described. As a result, regions 1018, 1020, 1021, and 1023 are lightly doped with P ions.

Figure 10E:
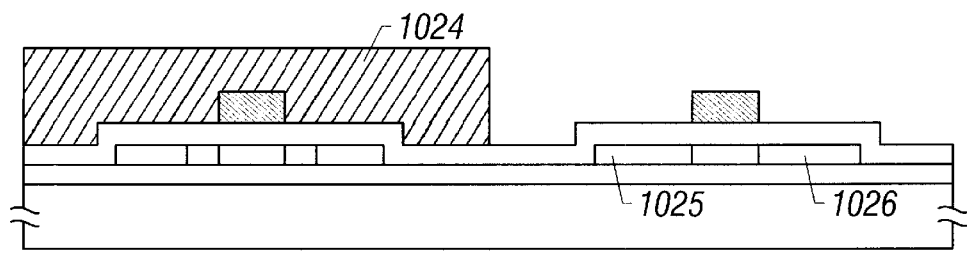

Then, as shown in FIG. 10(E), B ions are implanted while masking the N-channel TFT portion by a resist mask 1024. This implantation is made under such conditions that the N-type regions 1015, 1021, 1017, and 1023 are converted into P-type. Since the regions 1021 and 1023 are lightly doped with P ions, regions 1025 and 1026 can be converted into P-type without performing a high-dose boron implant, as previously described in other examples. The regions 1025 and 1026 are required as source/drain regions of the P-channel TFT.

After the ion implantation shown in FIG. 10(E), laser irradiation is carried out to active the implanted dopant ions and to anneal out the damage caused by the implantation. Manufacturing steps similar to the steps of other examples are performed. In this way, N-channel and P-channel TFTs are completed.

The N-channel TFT has the source region 1012, the lightly doped region 1018, the channel formation region 1019, the lightly doped region 1020 (LDD region), and the drain region 1014. On the other hand, the P-channel TFT has the source region 1025, the channel formation region 1022, and the drain region 1026. In the step shown in FIG. 10(D) if a low-dose implant is not effected, P ions are not implanted into the regions 1018 and 1020 at a low dose. In this case, these regions can be used as offset gate regions.

EXAMPLE 9

In the present example, LDD regions or offset gate regions are formed without utilizing anodization. The process sequence of the present example is illustrated in FIGS. 11(A)–11(E). First, a silicon oxide film 1102 is formed as a buffer layer on a glass substrate 1101. An active layer, 1103 and 1104, made of crystalline silicon is formed. The active layer portion 1103 will become the active layer of an N-channel TFT, while the active layer portion 1104 will become the active layer of a P-channel TFT.

Then, a silicon oxide film 1105 acting as a gate-insulating film is grown. Thereafter, a silicon film consisting of microcrystallites heavily doped with P or B is formed. Using a resist mask (not shown), the film is patterned to form a film pattern, indicated by 1106 and 1107. Gate electrodes will be formed from this film pattern.

Figure 11A:
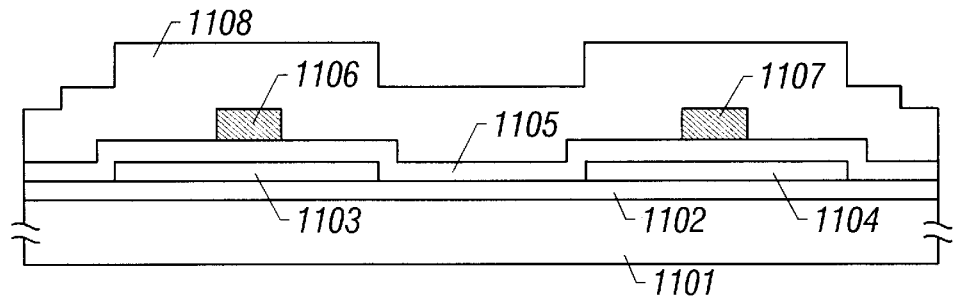
FIGS. 11(A)–11(E) are cross-sectional views of a yet additional CMOS TFT circuit according to the invention, illustrating a process sequence for fabricating the circuit.
Figure 11B:
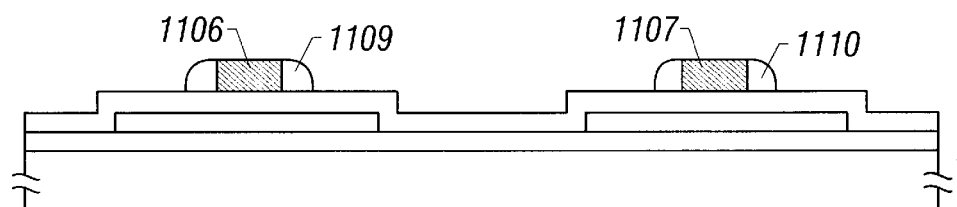

Thereafter, a silicon nitride film 1108 is formed, thus obtaining a state shown in FIG. 11(A). This silicon nitride film 1108 is etched by a dry etching process having vertical anisotropy. At this time, the etching conditions are appropriately selected in such a way that substantially triangular residues, 1109 and 1110, of silicon nitride are created. In this way, a state shown in FIG. 11(B) is obtained.

Figure 11C:
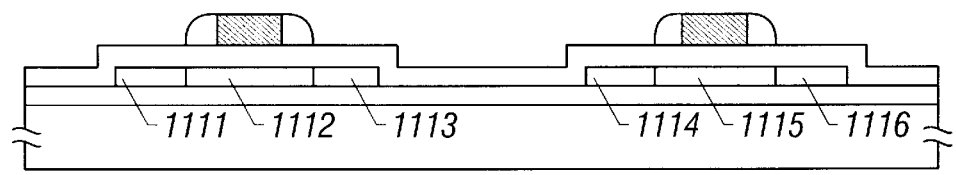
Figure 11D:
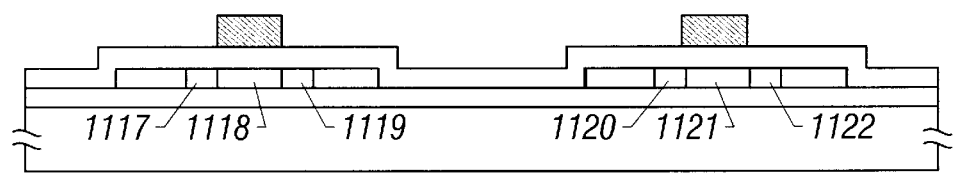

Then, in a manufacturing step shown in FIG. 11(C), P ions are implanted at a heavy dose. As a result, regions 1111, 1113, 1114, and 1116 are heavily doped with P ions. Regions 1112 and 1115 are left undoped. Subsequently, the silicon nitride film, 1109 and 1110, is removed. Under a condition shown in FIG. 11(D), P ions are implanted at a light dose. As a result, regions 1117, 1119, 1120, and 1122 become lightly doped regions (N- regions). Regions 1118 and 1121 become channel formation regions.

Figure 11E:
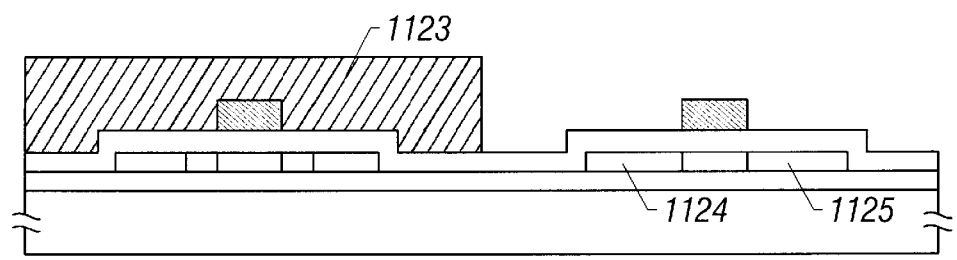
Figure 6A:
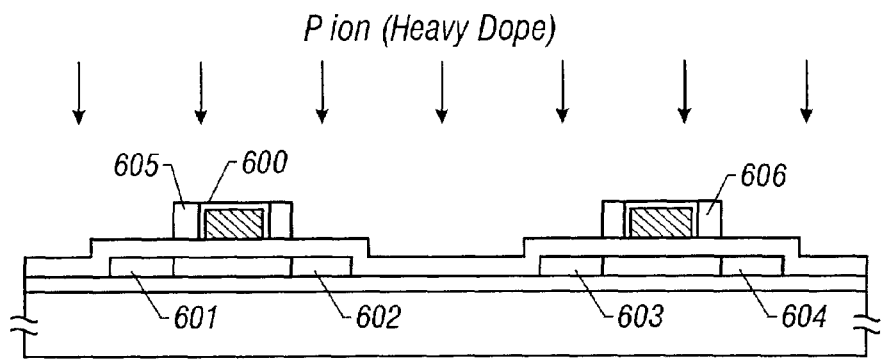
Figure 6B:
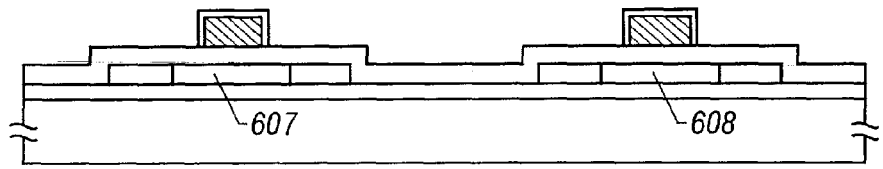
Figure 6C:
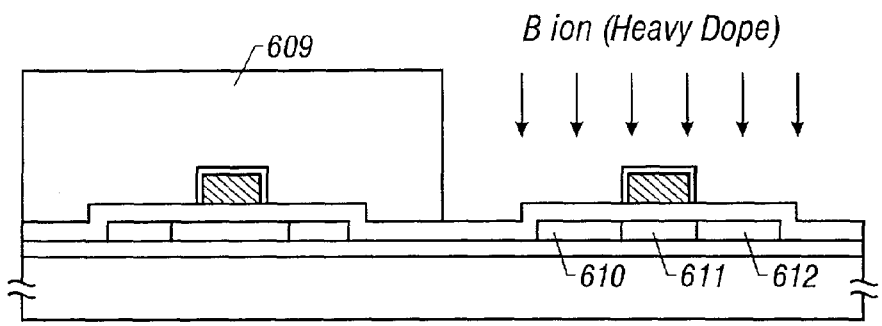
Figure 6D:
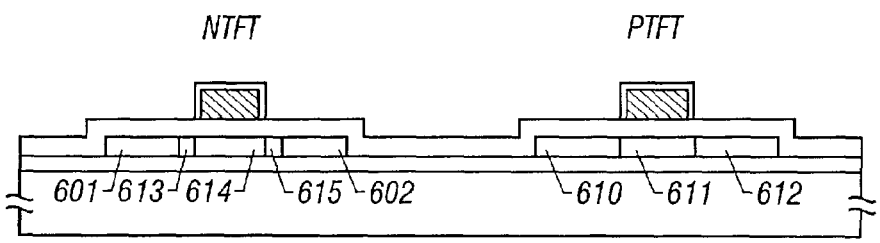
Figure 2A:
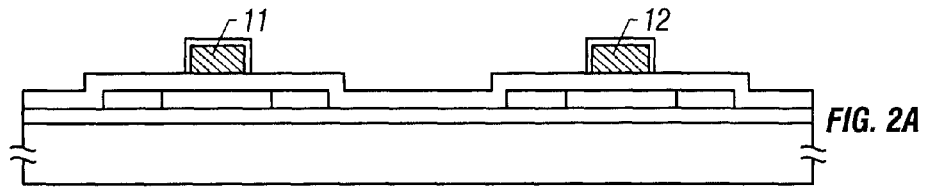
Figure 2B:
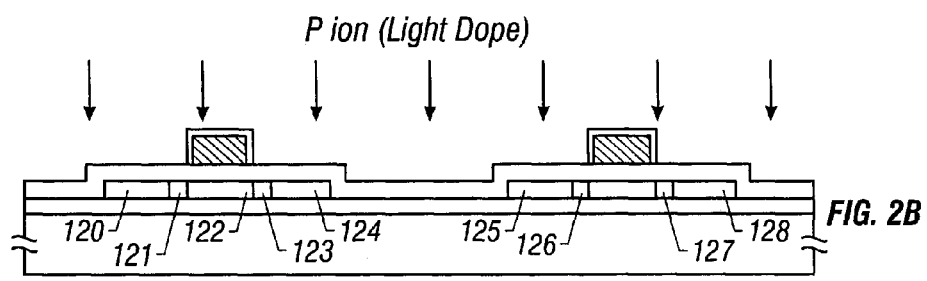
Figure 2C:
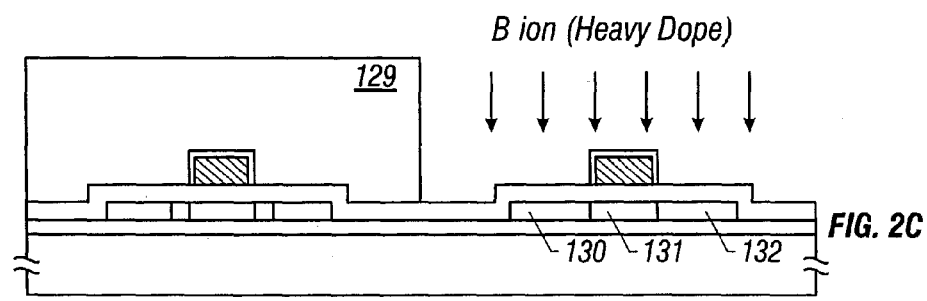
Figure 2D:
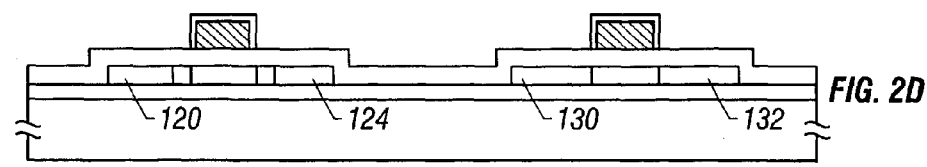
Figure 1A:
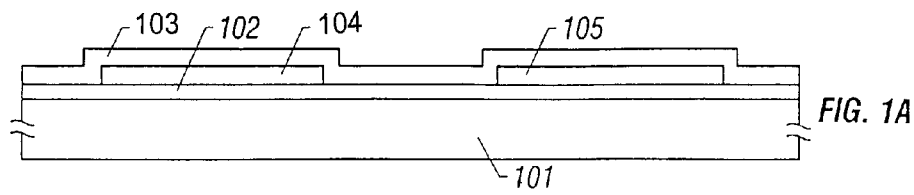
Figure 1B:
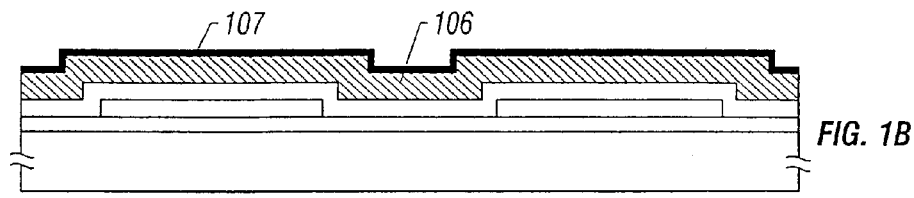
Figure 1C:
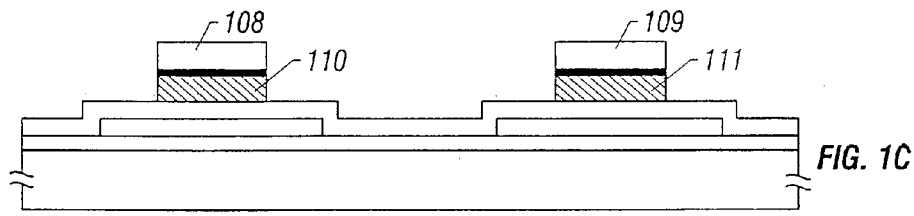
Figure 1D:
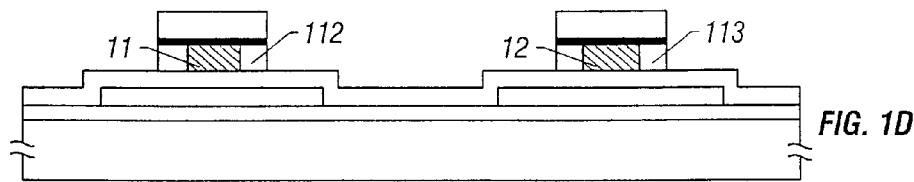
Figure 1E:
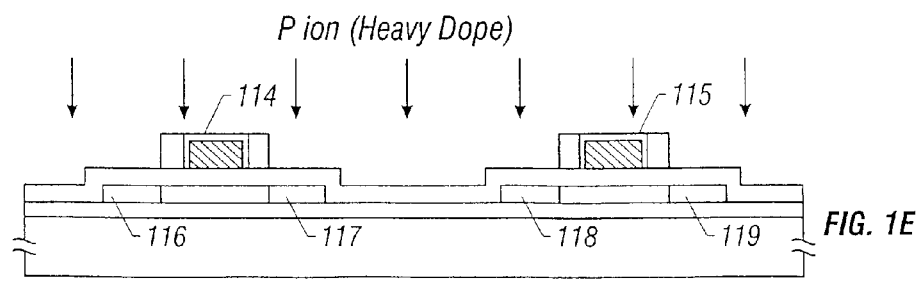

Thereafter, as shown in FIG. 11(E), B ions are implanted while masking the N-channel TFT portion by a resist mask 1123. This implantation is performed in such conditions that N-type regions 1114, 1116, 1120, and 1122 are converted into P-type. Since the regions 1120 and 1022 are lightly doped with P ions, regions 1124 and 1125 can be converted into P-type without performing a high-dose boron implant, as previously described in other examples. The regions 1124 and 1125 are required as source/drain regions of the P-channel TFT.

After the end of the implantation step shown in FIG. 11(E), laser irradiation is carried out to activate the implanted dopant ions and to anneal out the damage caused by the implantation. Manufacturing steps similar to the steps of other examples are performed. In this way, N-channel and P-channel TFTs are completed.

The N-channel TFT has a source region 1111, a lightly doped region 1112, a channel formation region 1118, a lightly doped region 1119 (LDD region), and a drain region 1113. On the other hand, the P-channel TFT has a source region 1124, a channel formation region 1121, and a drain region 1125. In the step shown in FIG. 11(D), if a low-dose implant is not effected, P ions are not implanted into the regions 1117 and 1119 at a low dose. In this case, these regions can be used as offset gate regions.

EXAMPLE 10

The present invention can be applied to an electrooptical device having the active matrix construction. Especially, the invention can be applied with great utility to a peripheral driver circuit incorporated in an integral electrooptical device. Besides peripheral driver circuits, at least parts of memories treating image signals and various kinds of signals and information-treating circuits can be constructed, making use of the present invention.

Specifically, the invention can be applied to various kinds of circuits integrated on one substrate, in addition to an active matrix circuit. Examples of the above-described electrooptical device include liquid crystal displays, electroluminescent devices, and electrochromic displays. They find practical applications in TV cameras, personal computers, car navigational systems, TV projection systems, video cameras, and portable intelligent terminals. Some of them are next described briefly by referring to FIGS. 12(A)–12(E).

Figure 12A:
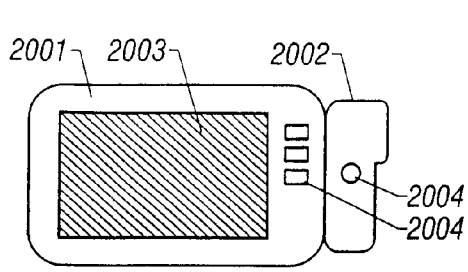
FIGS. 12(A)–12(E) are schematic views of various appliances utilizing electrooptical devices according to the invention.

Referring to FIG. 12(A), there is shown a TV camera. The body of this camera is indicated by numeral 2001. This TV camera comprises the body 2001, a camera section 2002, a display unit 2003, and operation switches 2004. The display unit 2003 is used as a viewfinder. This apparatus shown in FIG. 12(A) can be employed as a portable intelligent terminal.

Figure 12B:
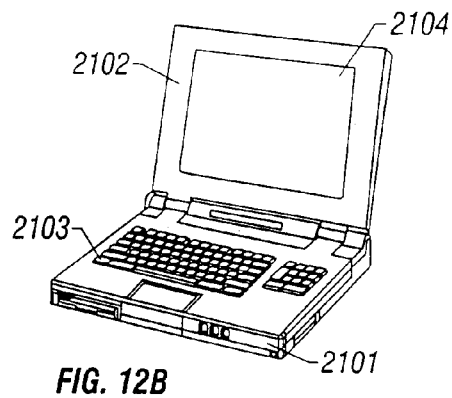

Referring next to FIG. 12(B), there is shown a personal computer. The body of this computer is indicated by numeral 2101. This personal computer comprises the body 2101, a cover 2102, a keyboard 2103, and a display unit 2104. The display unit 2104 is used as a monitor and required to have diagonal dimensions as large as more than ten inches.

Figure 12C:
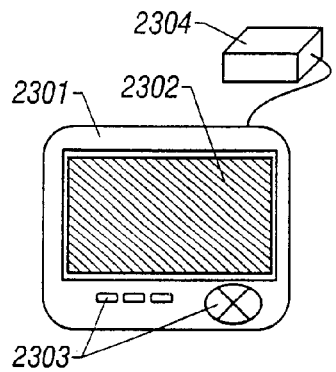

Referring next to FIG. 12(C), there is shown a car navigational system. The body of this system is indicated by numeral 2301. The body 2301 includes a display unit 2302 and operation switches 2303. The navigational system further includes an antenna 2304. The display unit 2302 is used as a monitor.

Figure 12D:
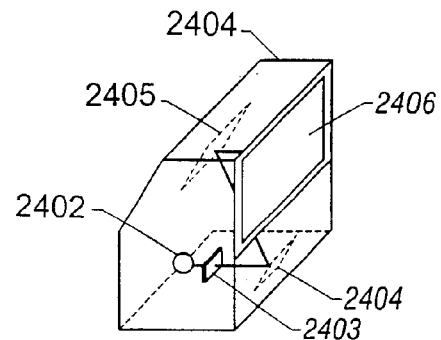

Referring next to FIG. 12(D), there is shown a TV projection system. The body of this system is indicated by numeral 2204. This body includes a light source 2402, a display unit 2403, mirrors 2404, 2405, and a screen 2406. An image displayed on the display unit 2403 is projected onto the screen 2406 and so the display unit 2403 is required to have high resolution.

Figure 12E:
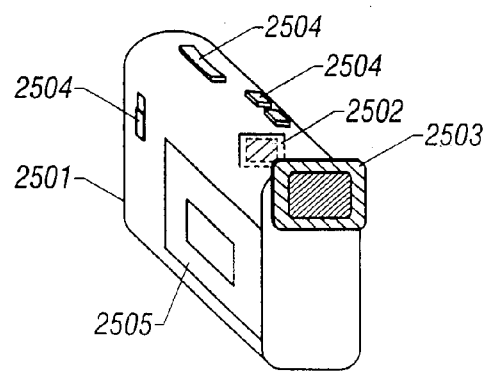

Referring next to FIG. 12(E), there is shown a video camera. The body of this camera is indicated by numeral 2501. This body includes a display unit 2502, an eyepiece 2503, operation switches 2504, and a tape holder 2505. An image picked up and displayed on the display unit 2502 can be viewed on a real-time basis through the eyepiece 2503. Hence, the user can take pictures while watching the image.

The present invention yields the following advantages.

(1) Only one implant mask is necessary to fabricate a CMOS structure and so the manufacturing processing can be simplified.

(2) Lightly doped regions are formed only in the N-channel TFT. Therefore, a CMOS structure having well balanced characteristics can be manufactured.

(3) Since no quite heavy doping is necessary, the resist can be prevented from being modified in quality.

(4) The conductivity type can be easily converted, because regions adjacent to the channel are intrinsic or lightly doped regions.

(5) Since the active layer is coated with a silicon oxide film, contamination and surface roughening can be circumvented.

What is claimed is:

1. A semiconductor device comprising:

a substrate;

a P-channel thin-film transistor formed on said substrate and comprising a first source region and a first drain region that are doped with both P-type and N-type dopants, and a first channel region located between said first source region and said first drain region, wherein said first source region and said first drain region include portions of a P-type conductivity adjacent to said first channel region that are more lightly doped with said N-type dopant than other portions of said first source region and said first drain region; and an N-channel thin-film transistor formed on said substrate adjacent to said P-channel thin-film transistor and comprising a second source region and a second drain region, a second channel region between said second source region and said second drain region, and an N-region located between said second channel region and at least one of said second source region and said second drain region.

2. The device of claim 1 wherein said N- region has a graded concentration distribution of N-type dopant contained therein.

3. The device of claim 1 wherein said device is used in a Tv camera, a personal computer, a car navigational system, a TV projection system, a video camera, a portable intelligent terminal.

4. A semiconductor device comprising:

a P-channel thin-film transistor comprising a source region and a drain region, a channel region provided between said source region and said drain region, and a gate electrode provided adjacent to said channel region with a gate insulating layer therebetween, an N-channel thin-film transistor comprising a source region and a drain region, a channel region provided between said source region and said drain region of said N-channel thin-film transistor, and an N-region provided between said channel region of said N-channel thin-film transistor and at least one of said source region and said drain region of said N-channel thin-film transistor, wherein said source region and said drain region of said P-channel thin-film transistor are doped with P-type and N-type dopants, wherein portions in said source region and said drain region of said P-channel thin-film transistor which are adjacent to said channel region of said P-channel thin-film transistor are more lightly doped with said N-type dopant than other portions of said source region and said drain region of said P-channel thin-film transistor, wherein said P-type dopant in said source region and said drain region of said P-channel thin-film transistor has a quantity sufficient to convert conductivity type from N-type of said N-type dopant to P-type of said P-type dopant, and wherein an edge of said gate electrode of said P-channel thin-film transistor is substantially aligned with a junction between said channel region of said P-channel thin-film transistor and at least one of said source region and said drain region of said P-channel thin-film transistor.

5. The device of claim 4 wherein said gate insulating layer is provided on said source region and said drain region of said P-channel thin-film transistor.

6. A semiconductor device comprising:

a P-channel thin-film transistor comprising a source region and a drain region, a channel region provided between said source region and said drain region, and a gate electrode provided adjacent to said channel region with a gate insulating layer therebetween, an N-channel thin-film transistor comprising a source region and a drain region, a channel region provided between said source region and said drain region of said N-channel thin-film transistor, and an N- region provided between said channel region and at least one of said source region and said drain region of said N-channel thin-film transistor, wherein said source region and said drain region of said P-channel thin-film transistor are doped with P-type and N-type dopants, wherein portions in said source region and said drain region of said P-channel thin-film transistor which are adjacent to said channel region of said P-channel thin-film transistor are more lightly doped with said N-type dopant than other portions of said source region and said drain region of said P-channel thin-film transistor, wherein said P-type dopant in said source region and said drain region has a quantity sufficient to convert conductivity type from N-type of said N-type dopant to P-type of said P-type dopant, and wherein an edge of said gate electrode of said P-channel thin-film transistor is offset from a junction between said channel region of said P-channel thin-film transistor and at least one of said source region and said drain region of said P-channel thin-film transistor.

7. The device of claim 6 wherein said edge of said gate electrode of said P-channel thin-film transistor is offset from said junction by an anodic oxide provided on a side of said gate electrode of said P-channel thin-film transistor.

8. A semiconductor device comprising:

a P-channel thin-film transistor comprising a source region and a drain region, and a channel region provided between said source region and said drain region, an N-channel thin-film transistor comprising a source region and a drain region, a channel region provided between said source region and said drain region of said N-channel thin-film transistor, and an N-region provided between said channel region of said N-channel thin-film transistor and at least one of said source region and said drain region of said N-channel thin-film transistor, wherein said source region and said drain region of said P-channel thin-film transistor are doped with a P-type dopant, wherein portions of said source region and said drain region of said P-channel thin-film transistor which are distant from said channel region of said P-channel thin-film transistor are doped with an N-type dopant, wherein said P-type dopant in said source region and said drain region of said P-channel thin-film transistor has a quantity sufficient to convert conductivity type from N-type of said N-type dopant to P-type of said P-type dopant.

9. A semiconductor device comprising:

a P-channel thin-film transistor comprising a source region and a drain region, a channel region provided between said source region and said drain region, and a gate electrode provided adjacent to said channel region with a gate insulating layer therebetween, an N-channel thin-film transistor comprising a source region and a drain region, a channel region provided between said source region and said drain region of said N-channel thin-film transistor, and an N- region provided between said channel region and at least one of said source region and said drain region of said N-channel thin-film transistor, wherein said source region and said drain region of said P-channel thin-film transistor are doped with a P-type dopant, wherein portions of said source region and said drain region of said P-channel thin-film transistor which are distant from said channel region of said P-channel thin-film transistor are doped with an N-type dopant, wherein said P-type dopant in said source region and said drain region of said P-channel thin-film transistor has a quantity sufficient to convert conductivity type from N-type of said N-type dopant to P-type of said P-type dopant, and wherein an edge of said gate electrode of said P-channel thin-film transistor is substantially aligned with a junction between said channel region of said P-channel thin-film transistor and at least one of said source region and said drain region of said P-channel thin-film transistor.

10. A semiconductor device comprising:

a P-channel thin-film transistor comprising a source region and a drain region, a channel region provided between said source region and said drain region, and a gate electrode provided adjacent to said channel region with a gate insulating layer therebetween, an N-channel thin-film transistor comprising a source region and a drain region, a channel region provided between said source region and said drain region of said N-channel thin-film transistor, and an N- region provided between said channel region of said N-channel thin-film transistor and at least one of said source region and said drain region of said N-channel thin-film transistor, wherein said source region and said drain region of said P-channel thin-film transistor are doped with a P-type dopant, wherein portions of said source region and said drain region of said P-channel thin-film transistor are doped with a P-type dopant, wherein portions of said source region and said drain region of said P-channel thin-film transistor which are distant from said channel region of said P-channel thin-film transistor are doped with an N-type dopant, wherein said P-type dopant in said source region and said drain region of said P-channel thin-film transistor has a quantity sufficient to convert conductivity type from N-type of said N-type dopant to P-type of said P-type dopant, and wherein an edge of said gate electrode of said P-channel thin-film transistor is offset from a junction between said channel region of said P-channel thin-film transistor and at least one of said source region and said drain region of said P-channel thin-film transistor.

11. A semiconductor device comprising:

a P-channel thin-film transistor comprising a source region and a drain region, and a channel region provided between said source region and said drain region, an N-channel thin-film transistor comprising a source region and a drain region, a channel region provided between said source region and said drain region of said N-channel thin-film transistor, and an N- region provided between said channel region of said N-channel thin-film transistor and at least one of said source region and said drain region of said N-channel thin-film transistor, wherein said source region and said drain region of said P-channel thin-film transistor are doped with P-type and N-type dopants, wherein portions in said source region and said drain region of said P-channel thin-film transistor which are adjacent to said channel region of said P-channel thin-film transistor are more lightly doped with said N-type dopant than other portions of said source region and said drain region of said P-channel thin-film transistor, and wherein said P-type dopant in said source region and said drain region of said P-channel thin-film transistor has a quantity sufficient to convert conductivity type from N-type of said N-type dopant to P-type of said P-type dopant.

12. A semiconductor device comprising:

a P-channel thin-film transistor comprising a source region and a drain region, a channel region provided between said source region and said drain region, and a gate electrode provided adjacent to said channel region with a gate insulating layer therebetween an N-channel thin-film transistor comprising a source region and a drain region, a channel region provided between said source region and said drain region of said N-channel thin-film transistor, and an N- region provided between said channel region of said N-channel thin-film transistor and at least one of said source region and said drain region of said N-channel thin-film transistor, wherein said source region and said drain region of said P-channel thin-film transistor are doped with P-type and N-type dopants, wherein portions in said source region and said drain region of said P-channel thin-film transistor which are adjacent to said channel region of said P-channel thin-film transistor are more lightly doped with said N-type dopant than other portions of said source region and said drain region of said P-channel thin-film transistor, wherein said P-type dopant in said source region and said drain region of said P-channel thin-film transistor has a quantity sufficient to convert conductivity type from N-type of said N-type dopant to P-type of said P-type dopant, and wherein an edge of said gate electrode of said P-channel thin-film transistor is substantially aligned with a junction between said channel region of said P-channel thin-film transistor and at least one of said source region and said drain region of said P-channel thin-film transistor.

13. A semiconductor device comprising:

a P-channel thin-film transistor comprising a source region and a drain region, a channel region provided between said source region and said drain region, and a gate electrode provided adjacent to said channel region with a gate insulating layer therebetween, an N-channel thin-film transistor comprising a source region and a drain region, a channel region provided between said source region and said drain region of said N-channel thin-film transistor, and an N- region provided between said channel region of said N-channel thin-film transistor and at least one of said source region and said drain region of said N-channel thin-film transistor, wherein said source region and said drain region of said P-channel thin-film transistor are doped with P-type and N-type dopants, wherein portions in said source region and said drain region of said P-channel thin-film transistor which are adjacent to said channel region of said P-channel thin-film transistor are more lightly doped with said N-type dopant than other portions of said source region and said drain region of said P-channel thin-film transistor, wherein said P-type dopant in said source region and said drain region of said P-channel thin-film transistor has a quantity sufficient to convert conductivity type from N-type of said N-type dopant to P-type of said P-type dopant, and wherein an edge of said gate electrode of said P-channel thin-film transistor is offset from a junction between said channel region of said P-channel thin-film transistor and at least one of said source region and said drain region of said P-channel thin-film transistor.

* * * * *

UNITED STATES PATENT AND TRADEMARK OFFICE
CERTIFICATE OF CORRECTION

PATENT NO.   : 5,949,107
DATED        : September 7, 1999
INVENTOR(S)  : Hongyong Zhang It is certified that error appears in the above-identified patent and that said Letters Patent is hereby corrected as shown below:

Drawings,
Please replace Figres 6A, 6B, 6C and 6D with the attached drawing sheet.

Signed and Sealed this

Twenty-seventh Day of August, 2002

Attest:

JAMES E. ROGAN
Attesting Officer    Director of the United States Patent and Trademark Office

UNITED STATES PATENT AND TRADEMARK OFFICE
CERTIFICATE OF CORRECTION

PATENT NO.   : 5,949,107
DATED        : September 7, 1999
INVENTOR(S)  : Hongyong Zhang It is certified that error appears in the above-identified patent and that said Letters Patent is hereby corrected as shown below:

Drawings,
Please replace Figres 2A, 2B, 2C and 2D with the attached drawing sheet.

Signed and Sealed this

Eleventh Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 5,949,107
DATED : September 7, 1999
INVENTOR(S) : Hongyong Zhang

It is certified that error appears in the above-identified patent and that said Letters Patent is hereby corrected as shown below:

Drawings,
Please replace Figs. 1A-1E with the attached drawing sheet.
Please replace Figs. 12A-12E with the attached drawing sheet.

Column 17,
Lines 19 and 38, change each occurrence of "N-region" to -- $N^-$ region --.

Column 18,
Lines 10 and 44, change each occurrence of "N-region" to -- $N^-$ region --.

Column 19,
Lines 4 and 35, change each occurrence of "N-region" to -- $N^-$ region --.

Column 20,
Lines 2 and 31, change each occurrence of "N-region" to -- $N^-$ region --.

Column 21,
Line 1, change "N-region" to -- $N^-$ region --.

Signed and Sealed this

Sixth Day of April, 2004

JON W. DUDAS
*Acting Director of the United States Patent and Trademark Office*